United States Patent
Jeong et al.

(10) Patent No.: US 9,455,377 B2
(45) Date of Patent: Sep. 27, 2016

(54) LIGHT EMITTING DEVICE

(71) Applicant: LG INNOTEK CO., LTD., Seoul (KR)

(72) Inventors: Hwan Hee Jeong, Seoul (KR); Sang Youl Lee, Seoul (KR); June O Song, Seoul (KR); Kwang Ki Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 212 days.

(21) Appl. No.: 14/179,420

(22) Filed: Feb. 12, 2014

(65) Prior Publication Data

US 2014/0159095 A1    Jun. 12, 2014

Related U.S. Application Data

(63) Continuation of application No. 12/943,628, filed on Nov. 10, 2010, now Pat. No. 8,653,547.

(30) Foreign Application Priority Data

Mar. 10, 2010  (KR) .................. 10-2010-0021289

(51) Int. Cl.
| | |
|---|---|
| *H01L 33/00* | (2010.01) |
| *H01L 33/36* | (2010.01) |
| *H01L 33/22* | (2010.01) |
| *H01L 33/38* | (2010.01) |
| *H01L 33/40* | (2010.01) |
| *H01L 33/60* | (2010.01) |
| *H01L 33/42* | (2010.01) |

(52) U.S. Cl.
CPC ............... *H01L 33/36* (2013.01); *H01L 33/22* (2013.01); *H01L 33/38* (2013.01); *H01L 33/405* (2013.01); *H01L 33/60* (2013.01); *H01L 33/42* (2013.01); *H01L 2224/45139* (2013.01); *H01L 2224/48091* (2013.01); *H01L 2924/12032* (2013.01); *H01L 2933/0016* (2013.01)

(58) Field of Classification Search
CPC ....... H01L 33/42; H01L 33/20; H01L 33/38; H01L 33/0079
See application file for complete search history.

(56) References Cited

U.S. PATENT DOCUMENTS

| | | |
|---|---|---|
| 5,157,468 A | 10/1992 | Matsumoto |
| 8,084,776 B2 | 12/2011 | Kim |
| 2003/0132445 A1 | 7/2003 | Yoshitake et al. |
| 2003/0222269 A1 | 12/2003 | Lin et al. |

(Continued)

FOREIGN PATENT DOCUMENTS

| | | |
|---|---|---|
| CN | 1619845 A | 5/2005 |
| EP | 1271665 A2 | 1/2003 |

(Continued)

*Primary Examiner* — Zandra Smith
*Assistant Examiner* — John M Parker
(74) *Attorney, Agent, or Firm* — Dentons US LLP

(57) ABSTRACT

A light emitting device includes a metal layer, a light emitting structure, an electrode disposed on a first upper portion of a second conductive type semiconductor layer, a current spreading portion disposed on a second upper portion of the second conductive type semiconductor layer, an adhesive layer disposed under a first conductive type semiconductor layer, an insulating layer disposed between the electrode and the adhesive layer, a passivation layer disposed on a side surface of the light emitting structure and on a at least one upper surface of the light emitting structure, and a reflective layer disposed between the metal layer and the first conductive type semiconductor layer.

30 Claims, 16 Drawing Sheets

(56) References Cited

U.S. PATENT DOCUMENTS

| | | |
|---|---|---|
| 2005/0035354 A1* | 2/2005 | Lin .................. H01L 33/42 |
| | | 257/79 |
| 2005/0104081 A1 | 5/2005 | Kim et al. |
| 2005/0212002 A1* | 9/2005 | Sanga ................ H01L 33/20 |
| | | 257/96 |
| 2005/0253157 A1 | 11/2005 | Ohashi et al. |
| 2006/0043405 A1 | 3/2006 | Hata |
| 2006/0202219 A1 | 9/2006 | Ohashi et al. |
| 2006/0289886 A1 | 12/2006 | Sakai |
| 2007/0018184 A1 | 1/2007 | Beeson et al. |
| 2008/0006838 A1 | 1/2008 | Hattori et al. |
| 2008/0217635 A1 | 9/2008 | Emerson et al. |
| 2008/0308829 A1* | 12/2008 | Liu .................. H01L 33/38 |
| | | 257/98 |
| 2008/0315232 A1 | 12/2008 | Matsuo et al. |
| 2009/0224269 A1 | 9/2009 | Saeki et al. |
| 2010/0032701 A1 | 2/2010 | Fudeta |
| 2010/0093123 A1 | 4/2010 | Cho et al. |
| 2010/0200884 A1* | 8/2010 | Lee .................. H01L 33/0079 |
| | | 257/98 |
| 2010/0213493 A1 | 8/2010 | Hsu et al. |

FOREIGN PATENT DOCUMENTS

| | | |
|---|---|---|
| EP | 1 876 645 A2 | 1/2008 |
| EP | 2333852 A2 | 6/2011 |
| JP | 61-121373 | 6/1986 |
| JP | 07-106631 | 4/1995 |
| JP | 08222763 A | 8/1996 |
| JP | 2007-019263 A | 1/2007 |
| JP | 2008-034822 A | 2/2008 |
| JP | 2008-282966 A | 11/2008 |
| JP | 2009-094107 A | 4/2009 |
| JP | 2009188422 | 8/2009 |
| JP | 2009-200332 A | 9/2009 |
| JP | 2008210900 | 9/2009 |
| KR | 10-2005-0013042 A | 2/2005 |
| KR | 100809216 | 2/2008 |
| WO | 02/13281 | 2/2002 |
| WO | 2006/011458 | 2/2006 |
| WO | 2006/062300 | 6/2006 |
| WO | 2006082687 A1 | 8/2006 |
| WO | 2009/005477 | 1/2009 |
| WO | 2009019836 A2 | 2/2009 |

* cited by examiner

FIG.3
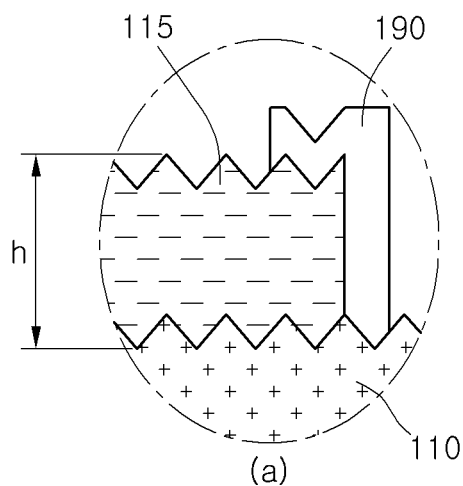
(a)
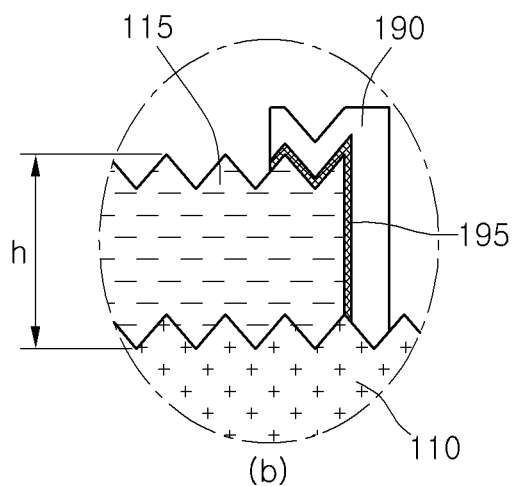
(b)
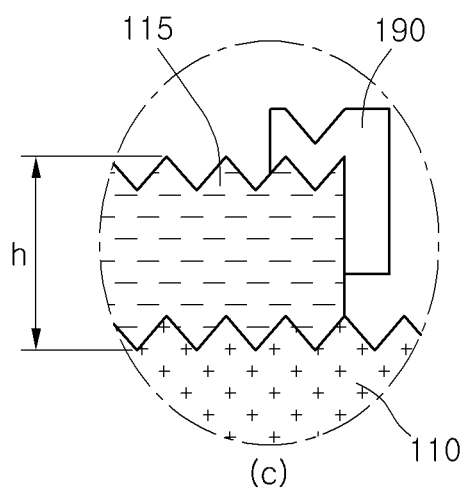
(c)

LIGHT EMITTING DEVICE

CROSS-REFERENCE TO RELATED APPLICATIONS

The present application is a continuation application of U.S. Ser. No. 12/943,628, filed Nov. 10, 2010, which claims priority under 35 U.S.C. §119(a) of Korean Patent Application No. 10-2010-0021289 filed on Mar. 10, 2010, which are hereby incorporated by reference in their entirety as if fully set forth herein.

BACKGROUND

Embodiments relate to a light emitting device and a light emitting device package.

A light emitting diode (LED) is a kind of a semiconductor device for converting electric energy into light. The LED has advantages such as low power consumption, a semi-permanent life cycle, a fast response time, safety, and environment friendly compared to the related art light source such as a fluorescent lamp and an incandescent bulb. Many studies are being in progress in order to replace the related art light source with an LED. Also, the LED is being increasingly used according to the trend as light sources of a lighting device such as a variety of lamps and streetlights, a lighting unit of a liquid crystal display device, and a scoreboard in indoor and outdoor places.

SUMMARY

Embodiments provide a light emitting device having a new structure and a light emitting device package.

Embodiments also provide a light emitting device having improved light emitting efficiency.

Embodiments also provide a light emitting device having improved light extraction efficiency.

Embodiments also provide a light emitting device, which emits uniform light.

In one embodiment, a light emitting device includes: a first electrode; a light emitting structure including a first semiconductor layer, an active layer, and a second semiconductor layer on the first electrode; a second electrode on the light emitting structure; and a reflective member on at least lateral surface of the second electrode.

In another embodiment, a light emitting device includes: a first electrode; an adhesive layer on the first electrode; a reflective layer on the adhesive layer; an ohmic contact layer on the reflective layer; a channel layer on the adhesive layer disposed on a lateral surface of the ohmic contact layer; a light emitting structure including a first semiconductor layer on the channel layer and the ohmic contact layer, an active layer on the first semiconductor layer, and a second semiconductor layer on the active layer; a second electrode on the light emitting structure, the second electrode having an inclined and uneven surface at least lateral surface thereof; a reflective member on the at least lateral surface of the second electrode, the reflective member having a shape corresponding to that of the lateral surface of the second electrode; and a passivation layer extending from a top surface of the channel layer to a lateral surface of the light emitting structure.

In further another embodiment, a light emitting device package includes: a body; at least one lead electrode on the body; and a light emitting device electrically connected to the lead electrode, wherein the light emitting device includes: a first electrode; a light emitting structure including a first semiconductor layer, an active layer, and a second semiconductor layer on the first electrode; a second electrode on the light emitting structure; and a reflective member on at least lateral surface of the second electrode.

The details of one or more embodiments are set forth in the accompanying drawings and the description below. Other features will be apparent from the description and drawings, and from the claims.

BRIEF DESCRIPTION OF THE DRAWINGS

FIG. 3 is an enlarged view illustrating various formation structures of a second electrode and a reflective member in the light emitting device according to the first embodiment.

DETAILED DESCRIPTION OF THE EMBODIMENTS

Figure 1:
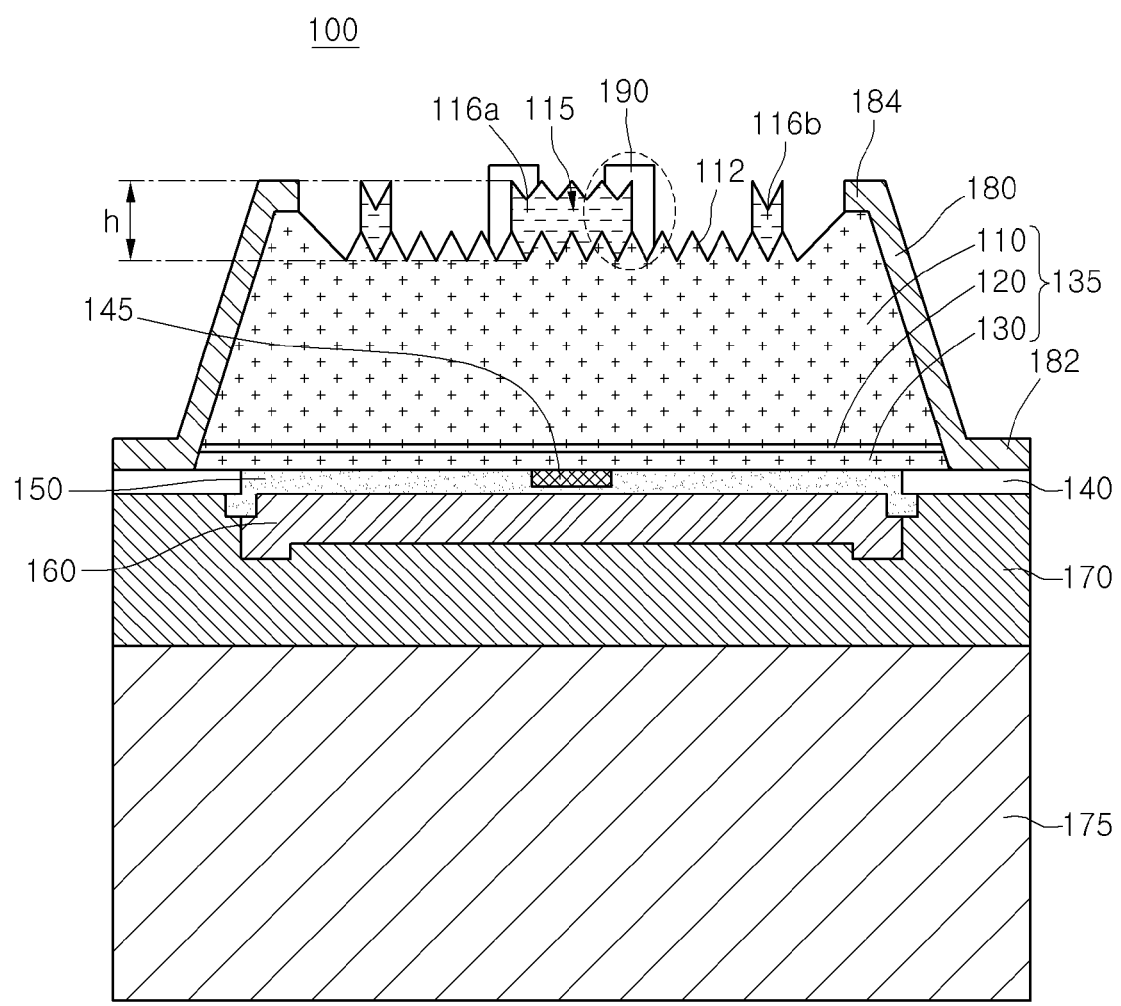
FIG. 1 is a side sectional view of a light emitting device according to a first embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

Hereinafter, embodiments will be described with reference to accompanying drawings. In the drawings, the thickness or size of each layer is exaggerated, omitted, or schematically illustrated for convenience in description and clarity. Also, the size of each element does not entirely reflect an actual size.

Figure 2:
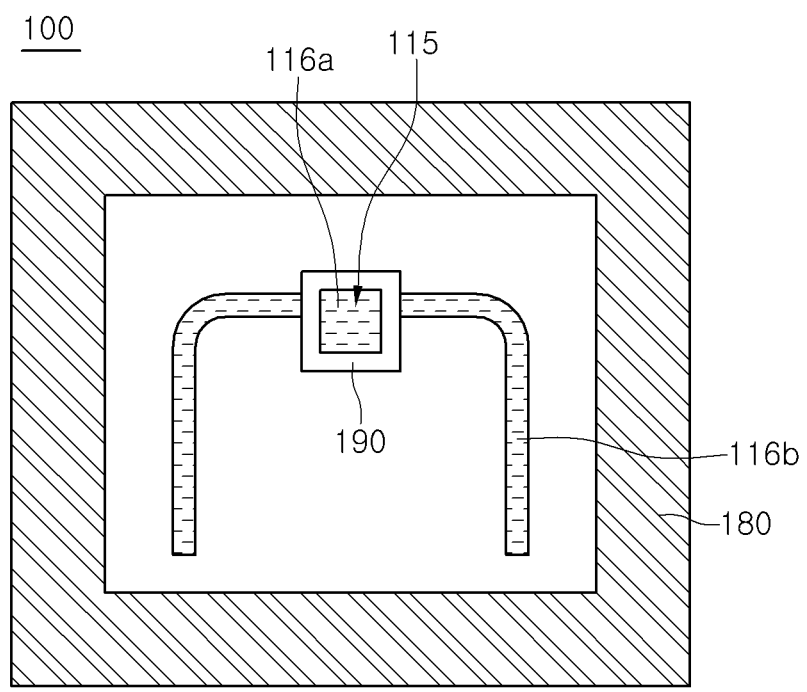
FIG. 2 is a plan view illustrating the light emitting device of FIG. 1.

FIG. 1 is a side sectional view of a light emitting device according to a first embodiment, and FIG. 2 is a plan view illustrating the light emitting device of FIG. 1.

Referring to FIGS. 1 and 2, a light emitting device 100 according to a first embodiment may include a first electrode 175, an adhesive layer 170 on the first electrode 175, a reflective layer 160 on the adhesive layer 170, an ohmic contact layer 150 on the reflective layer 160, a channel layer 140 around a top surface of the adhesive layer 170, a light emitting structure 135 disposed on the ohmic contract layer 150 and the channel layer 140 to generate light, a second electrode 115 on the light emitting structure 135, and a reflective member 190 disposed on at least one side of the second electrode 115. The light emitting structure 135 may include a first conductive type semiconductor layer 130, an active layer 120, and a second conductive type semiconductor layer 110.

The first electrode 175 may support a plurality of layers thereon as well as serve as an electrode. The first electrode 175 together with the second electrode 115 may supply power to the light emitting structure 135.

For example, the first electrode 175 may include at least one selected from the group consisting of Ti, Ni, Pt, Au, W, Cu, Mo, Cu-M, and carrier wafers (e.g., Si, Ge, GaAs, ZnO, SiC, and SiGe).

The first electrode 175 may have a thickness changed according to a design of the light emitting device 100. For example, the first electrode 175 may have a thickness of about 30 μm to about 500 μm.

The first electrode 175 may be plated and/or deposited below the light emitting structure 135 or may adhere to light emitting structure 135 in a sheet form, but is not limited thereto.

The adhesive layer 170 may be disposed on the first electrode 175. The adhesive layer 170 may be a bonding layer and disposed below the channel layer 140. The adhesive layer 170 has exposed lateral surfaces. The adhesive layer 170 may contact the reflective layer 160, ends of the ohmic contact layer 150, and the channel layer 140 to serve as a medium for enhancing an adhesive force between the layers, e.g., between the channel layer 140, the ohmic contact layer 150, and the reflective layer 160 and the first electrode 175.

The adhesive layer 170 may be formed of a barrier metal or a bonding metal. For example, the adhesive layer 170 may include at least one selected from the group consisting of Ti, Au, Sn, Ni, Cr, Ga, In, Bi, Cu, Ag, and Ta.

The reflective layer 160 may be disposed on the adhesive layer 170. The reflective layer 160 may reflect light incident from the light emitting structure 135 to improve light extraction efficiency.

For example, the reflective layer 160 may include at least one selected from the group consisting of Ag, Ni, Al, Rh, Pd, Ir, Ru, Mg, Zn, Pt, Au, and Hf or an alloy thereof, but is not limited thereto. Also, the reflective layer 160 may have a multi-layered structure, which is formed by using the foregoing metals together with transparent conductive materials such as In—ZnO (IZO), Ga—ZnO (GZO), Al—ZnO (AZO), Al—Ga—ZnO (AGZO), In—Ga—ZnO (IGZO), indium zinc tin oxide (IZTO), indium aluminum zinc oxide (IAZO), indium gallium tin oxide (IGTO), and aluminum tin oxide (ATO). That is, for example, the reflective layer 160 may have a multi-layered structure such as IZO/Ni, AZO/Ag, IZO/Ag/Ni, or AZO/Ag/Ni.

The ohmic contact layer 150 may be disposed on the reflective layer 160. The ohmic contact layer 150 may contact the first conductive type semiconductor layer 130 to smoothly supply power to the light emitting structure 135.

Particularly, the ohmic contact layer 150 may be formed of one selected from the transparent conductive materials and the foregoing metals. For example, the ohmic contact layer may have a single- or multi-layered structure, which is formed by using at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

The ohmic contact layer 150 may have an end contacting the adhesive layer 170. The ohmic contact layer 150 may contact the entire region of the first conductive type semiconductor layer 130 except a region of the first conductive type semiconductor layer 130 overlapping with the channel layer 140. As described above, since the ohmic contact layer 150 contacts the first conductive type semiconductor layer 130 over as wide area as possible, current may be uniformly supplied to the active layer 120 through the entire region of the first conductive type semiconductor layer 130 contacting the ohmic contact layer 150. Thus, light emitting efficiency may be significantly improved.

A current blocking layer (CBL) 145 may be disposed on the ohmic contact layer 150 to contact the first conductive type semiconductor layer 130. At least portion of the CBL 145 may vertically overlap with the second electrode 115. The CBL 145 may block the current supplied into the first conductive type semiconductor layer 130 through the ohmic contact layer 150. Thus, the supply of the current supplied into the first conductive type semiconductor layer 130 may be blocked at and around the CBL 145. That is, the CBL 145 may maximally prevent the current from concentrately flowing along the shortest path between the first electrode 175 and the second electrode 115. As a result, the current flows into a region between the ohmic contact layer 150 and the first conductive type semiconductor layer 130 except the CBL 145. Thus, since the current uniformly flows into the entire region of the first conductive type semiconductor layer 145, the light emitting efficiency may be significantly improved.

Although it maximally prevents the current from flowing along the shortest path between the first electrode 175 and the second electrode 115 by the CBL 145, the current flowing through the circumference of the CBL 145 flows into the shortest path between the first electrode 175 and the second electrode 115 in the first conductive type semiconductor layer 130 contacting the CBL 145. Thus, the current having the same or similar distribution flows into the shortest path between the first electrode 175 and the second electrode 115 and the region of the first conductive type semiconductor layer 145 except the shortest path.

The CBL 145 may be formed of a material having conductivity or insulativity less than that of the ohmic contact layer 150 or a material, which short-circuit contacts the first conductive type semiconductor layer 130. The CBL 145 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, TiO, Ti, Al, and Cr.

The CBL 145 may be disposed between the ohmic contact layer 150 and the first conductive type semiconductor layer 130 or between the reflective layer 160 and the ohmic contact layer 150, but is not limited thereto.

Also, the CBL 146 may be disposed inside a groove defined in the ohmic contact layer 150, may protrude from the ohmic contact layer 150, or may be disposed inside a hole passing through top and bottom surfaces of the ohmic contact layer 150, but is not limited thereto.

The channel layer 140 may be disposed on a circumference region of a top surface of the adhesive layer 170. That is, the channel layer 140 may be disposed on a circumference region between the light emitting structure 135 and the adhesive layer 170.

The channel layer 140 may be formed of a material having insulativity or a material having conductivity less than that of the light emitting structure 135. For example, the channel layer 140 may be formed of at least one selected from a group of consisting of $SiO_2$, $Si_xO_y$, $Si_3N_4$, $Si_xN_y$, $SiO_xN_y$, $Al_2O_3$, $TiO_2$. In this case, it may prevent the light emitting structure 135 and the first electrode 175 from being electrically short-circuited therebetween. Thus, reliability of the light emitting device 100 may be improved.

Alternatively, the channel layer 140 may be formed of a metal material having a superior adhesive force, for example, at least one selected from the group consisting of Ti, Ni, Pt, Pd, Rh, Ir, and W. In this case, the channel layer 140 may enhance an adhesive force between the light emitting structure 135 and the adhesive layer 170 to improve the reliability of the light emitting device 100. Also, since the channel layer 140 is not broken or broken pieces of the channel layer 140 are not generated in a chip separation process such as a laser scribing process in which a plurality of chips is divided into individual chip units and a laser lift off (LLO) process in which a substrate is removed, the reliability of the light emitting device 100 may be improved. Also, in case where the channel layer 140 ohmic-contacts the first conductive type semiconductor layer 130, since current may flow through the channel layer 140, light may be generated in the active layer 120 vertically overlapping with the channel layer 140. Thus, the light emitting efficiency of the light emitting device 100 may be further improved. For example, when the first conductive type semiconductor layer 130 is a p-type semiconductor layer, the channel layer 140 may be formed of a metal such Ti, Ni, and W, which form an ohmic-contact with respect to the p-type semiconductor, but is not limited thereto.

The light emitting structure 135 may be disposed on the ohmic contact layer 150 and the channel layer 140.

The light emitting structure 135 has lateral surfaces vertically or inclinedly formed by an isolation etching process in which the plurality of chips is divided into individual chip units. Also, a portion of a top surface of the channel layer 140 may be exposed.

The light emitting structure 135 may be formed of a plurality of group III-V compound semiconductor materials.

The light emitting structure 135 may include the first conductive type semiconductor layer 130, the active layer 120 on the first conductive type semiconductor layer 130, and the second conductive type semiconductor layer 110 on the active layer 120.

The first conductive type semiconductor layer 130 may be disposed on a portion of a region of the channel layer 140, the ohmic contact layer 150, and the CBL 145. The first conductive type semiconductor layer 130 may be a p-type semiconductor layer, which is doped with a p-type dopant. The p-type semiconductor layer may be formed of at least one of group III-V compound semiconductor materials, for example, at least one selected from the group consisting of GaN, AlN, AlGaN, InGaN, InN, InAlGaN, AlInN, AlGaAs, GaP, GaAs, GaAsP, and AlGaInP. The p-type dopant may be one of Mg, Zn, Ga, Sr, and Ba. The first conductive type semiconductor layer 130 may have a single- or multi-layered structure, but is not limited thereto.

The first conductive type semiconductor layer 130 may supply a plurality of carriers to the active layer 120.

The active layer 120 may be disposed on the first conductive type semiconductor layer 130. The active layer 120 may have at least one of a single quantum well structure, a multi quantum well (MQW) structure, a quantum wire structure, and a quantum dot structure, but is not limited thereto.

The active layer 120 may be formed at a cycle of a well layer and a barrier layer by using group III-V compound semiconductor materials. GaN, InGaN, and AlGaN may be used as component semiconductor materials for forming the active layer 120. Thus, the active layer 120 may be formed at a cycle of an InGaN well layer/GaN barrier layer, an InGaN well layer/AlGaN barrier layer, or an InGaN well layer/InGaN barrier layer, but is not limited thereto.

The active layer 120 may recombine a plurality of holes supplied from the first conductive type semiconductor layer 130 with a plurality of electrons supplied from the second conductive type semiconductor layer 110 to generate light having a wavelength corresponding to that of a band gap depending on a semiconductor material of the active layer 120.

Although not shown, a conductive clad layer may be disposed above and/or below the active layer 120. The conductive clad layer may be formed of an AlGaN-based semiconductor. For example, a p-type clad layer, which is doped with a p-type dopant may be disposed between the first conductive type semiconductor layer 130 and the active layer 120. Also, an n-type clad layer, which is doped with an n-type dopant may be disposed between the active layer 120 and the second conductive type semiconductor layer 110.

The conductive clad layer may serve as a stopper by which the plurality of holes and electrons supplied from the active layer 120 are not transferred into the first and second conductive type semiconductor layers 130 and 110. Thus, the holes and electrons supplied from the active layer 120 may be further recombined with each other by the conductive clad layer to improve the light emitting efficiency of the light emitting device 100.

The active layer 120 may be disposed on the second conductive type semiconductor layer 110. The second conductive type semiconductor layer 110 may be an n-type semiconductor layer, which is doped with the n-type dopant. The second conductive type semiconductor layer 110 may be formed of at least one of group III-V compound semiconductor materials, for example, at least one selected from the group consisting of GaN, AlN, AlGaN, InGaN, InN, InAlGaN, AlInN, AlGaAs, GaP, GaAs, GaAsP, and AlGaInP. The n-type dopant may be one of Si, Ge, Sn, Se, and Te. The second conductive type semiconductor layer 110 may have a single- or multi-layered structure, but is not limited thereto.

A roughness or unevenness 112 may be disposed on the second conductive type semiconductor layer 110 to improve the light emitting efficiency. The roughness or unevenness 112 may have a random pattern shape formed by a wet etch process or a periodic pattern shape similar to a photonic crystal structure formed by a patterning process, but is not limited thereto.

The roughness or unevenness 112 may periodically have a concave shape and a convex shape. Each of the concave shape and the convex shape may have a rounded surface or both inclined surfaces, which are met at an apex thereof.

An n-type semiconductor layer may be disposed below the first conductive type semiconductor layer 130. Since the first conductive type semiconductor layer 130 is the p-type semiconductor layer and the second conductive type semiconductor layer 110 is the n-type semiconductor layer, the light emitting structure may have at least one of an N-P junction structure, a P-N junction structure, an N-P-N junction structure, and a P-N-P junction structure.

The second electrode 115 may be disposed on a top surface of the light emitting structure 135. The second electrode 115 may include a current spreading pattern 116b, which spreads current to uniformly supply the current into an electrode pad region 116a to which a wire is bonded and the entire region of the light emitting structure 135 by being branched into at least one or more sides from the electrode pad region 116a.

The electrode pad region 116a may have a square shape, a circular shape, an oval shape, or a polygonal shape, but is not limited thereto.

The second electrode 115 may have a single- or multi-layered structure including at least one selected from the group consisting of Au, Ti, Ni, Cu, Al, Cr, Ag, and Pt. Also, the second electrode 115 may have a thickness h of about 1 μm to about 10 μm, particularly, about 2 μm to about 5 μm.

Examples of the multi-layered structure of the second electrode 115 may include an ohmic layer formed of a metal such as Cr to ohmic-contact the light emitting structure 130 in a first layer that is the lowest layer, a reflective layer formed of a metal such as Al or Ag and having a high reflectance property in a second layer disposed on the first layer, a first diffusion barrier layer formed of a metal such as Ni for preventing interlayer diffusion in a third layer disposed on the second layer, a conductive layer formed of a metal such as Cu and having high conductivity in a fourth layer disposed on the third layer, a second diffusion barrier layer formed of a metal such as Ni for preventing interlayer diffusion in a fifth layer disposed on the fourth layer, and an adhesive layer 170 formed of a metal such as Au or Ti having a high adhesive force to easily bond a wire, but are not limited thereto.

Also, the electrode pad region 116a and the current spreading pattern 116b may have the same stacked structure or stacked structures different from each other. For example, since the current spreading pattern 116b does not require the adhesive layer for wire-bonding, the adhesive layer may not be provided. Also, the current spreading pattern 116b may be formed of a material having transmittance and conductivity, e.g., including at least one selected from the group consisting of ITO, IZO, IZTO, IAZO, IGZO, IGTO, AZO, ATO, and ZnO.

When the roughness or unevenness 112 is disposed on the top surface of the light emitting structure 135, a roughness or unevenness having a shape equal or similar to that of the roughness or unevenness 112 may be naturally disposed on a top surface of the second electrode 115 by the roughness or unevenness 112. The roughness or unevenness of the second electrode 115 may allow the reflective member 190 (that will be described later) to be firmly coupled to the second electrode 115.

The reflective member 190 may be disposed on at least one lateral surface of the second electrode 115.

Since the lateral surface of the second electrode 115 has a vertical surface, a lateral surface of the reflective member 190 disposed on the lateral surface of the second electrode 115 may also have a vertical surface equal or similar to that of the second electrode 115.

The reflective member 190 may minimize a phenomenon in which light extracted through the top surface of the light emitting structure 135 is absorbed by the lateral surface of the second electrode 115. Specifically, since the second electrode 115 has a relatively thicker thickness of about 1 μm to about 10 μm, particularly, about 2 μm to about 5 μm, an amount of the light absorbed into the lateral surface of the second electrode 115 in the light extracted through the top surface of the light emitting structure 135 can in no way be negligible in an aspect of the light extraction efficiency. Thus, since the reflective member 190 that may reflect the entire light from at least lateral surface of the second electrode 115 is disposed, the light extraction efficiency of the light emitting device 100 may be significantly improved.

The reflective member 190 may have a thickness of about 1 μm to about 10 μm according to its manufacturing process. When the reflective member 190 has a thickness of less than about 10 μm, the thickness of the reflective member 190 becomes much thinner to reduce the reflectance property. Thus, the light may be absorbed into the second electrode 115 through the reflective member 190 as ever. When the reflective member 190 has a thickness of greater than about 10 μm, the thickness of the reflective member 190 becomes much thicker to reduce a light extraction region of the light emitting structure 135. Thus, the light extraction efficiency may be reduced. For example, the reflective member 190 may be formed of at least one or two or more alloys of Ag, Ni, Al, Rh, Pd, Ir, Ru, Mg, Zn, Pt, Au, and Hf.

FIG. 3 is an enlarged view illustrating various formation structures of the second electrode and the reflective member in the light emitting device according to the first embodiment.

Referring to FIG. 3A, the reflective member 190 may be disposed on the entire region of the lateral surface and a circumference region of the top surface of the second electrode 115, particularly, the electrode pad region 116a. Also, the reflective member 190 may extend to contact a top surface of the second conductive type semiconductor layer 110. The roughness or unevenness 112 equal or similar to the roughness or unevenness 112 disposed on the top surface of the second electrode 115 may be transferred onto the top surface of the reflective member 190 by the roughness or unevenness 112 disposed on the top surface of the second electrode 115, but is not limited thereto.

Referring to FIG. 3B, the reflective member 190 may be disposed on the entire region of the lateral surface and a circumference region of the top surface of the second electrode 115, particularly, the electrode pad region 116a. Also, the reflective member 190 may extend to contact the top surface of the second conductive type semiconductor layer 110. An adhesive layer 195 may be disposed between the reflective member 190 and the second electrode 115, particularly, the electrode pad region 116a to improve an adhesive force therebetween. The adhesive layer 195 may be formed of a metal material having a superior adhesive force such as Ni, Pt, or Ti.

Referring to FIG. 3C, the reflective member 190 may be disposed on a portion of the lateral surface and the circumference region of the top surface of the second electrode 115, particularly, the electrode pad region 116a. Also, the reflective member 190 may not contact the top surface of the second conductive type semiconductor layer 110. That is to say, the reflective member 190 may extend from the circumference region of the top surface of the electrode pad region 116a to the portion of the lateral surface of the second electrode 115. The portion of the lateral surface of the electrode pad region 116a may be spaced from the top surface of the second conductive type semiconductor layer 110. The formation structure of the reflective member 190 may result from a mask disposed on the second conductive type semiconductor layer 110 in the process of forming the reflective member 190.

The reflective member 190 may be disposed to expose a portion of the top surface of the electrode pad region 116a. That is to say, the portion of the top surface of the electrode pad region 116a may not be covered by the reflective member 190. That is, the reflective member may not be disposed in a region in which the wire is bonded on the electrode pad region 116a.

Referring again to FIGS. 1 and 2, a passivation layer 180 may be formed on at least lateral surface of the light emitting structure 135. Particularly, the passivation layer 180 may have one end formed on the circumference region of the top surface of the second conductive type semiconductor layer 110 and the other end by way via or passing through the lateral surface of the light emitting structure 135 and formed on a top surface of the channel layer 140, but is not limited thereto. That is to say, the passivation layer 180 may extend from the top surface of the channel layer 140 to the circumference region of the top surface of the second conductive type semiconductor layer 110 via the lateral surfaces of the first conductive type semiconductor layer 130, the active layer 120, and the second conductive type semiconductor layer 110.

The passivation layer 180 may prevent electrical short circuit from occurring between the light emitting structure 135 and a conductive member such as an external electrode. For example, the passivation layer 180 may be formed of a material having insulativity such as $SiO_2$, $SiO_x$, $SiO_xN_y$, $Si_3N_4$, $TiO_2$, or $Al_2O_3$, but is not limited thereto.

Hereinafter, a method of manufacturing a light emitting device according to an embodiment will be described in detail. However, explanations duplicated with the foregoing explanations will be omitted or simply described.

FIGS. 4 to 14 are views illustrating a process of manufacturing the light emitting device according to the first embodiment.

Figure 4:
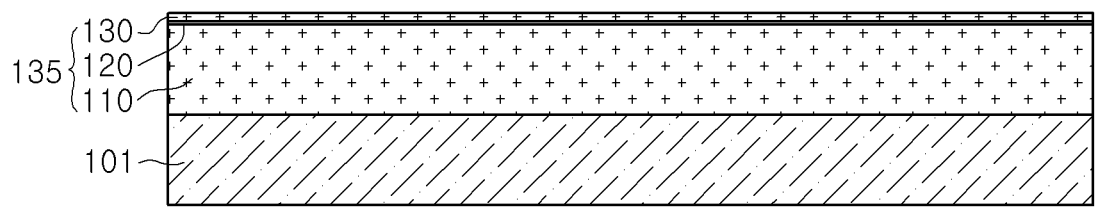
FIGS. 4 to 14 are views illustrating a process of manufacturing the light emitting device according to the first embodiment.

Referring to FIG. 4, a light emitting structure 135 may be formed on a substrate 101.

For example, the substrate 101 may include at least one selected from the group consisting of sapphire ($Al_2O_3$), SiC, GaAs, GaN, ZnO, Si, GaP, InP, and Ge, but is not limited thereto.

A second conductive type semiconductor layer 110, an active layer 120, and a first conductive type semiconductor layer 130 may be sequentially grown on the substrate 101 to form the light emitting structure 135.

For example, the light emitting structure 135 may be formed using at least one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

A buffer layer (not shown) or an undoped semiconductor layer (not shown) may be formed between the light emitting structure 135 and the substrate 101 to reduce a lattice constant difference therebetween.

The buffer layer may include at least one selected from the group consisting of InAlGaN, GaN, AlGaN, InGaN, AlInN, AlN, or InN, but is not limited thereto.

Figure 5:
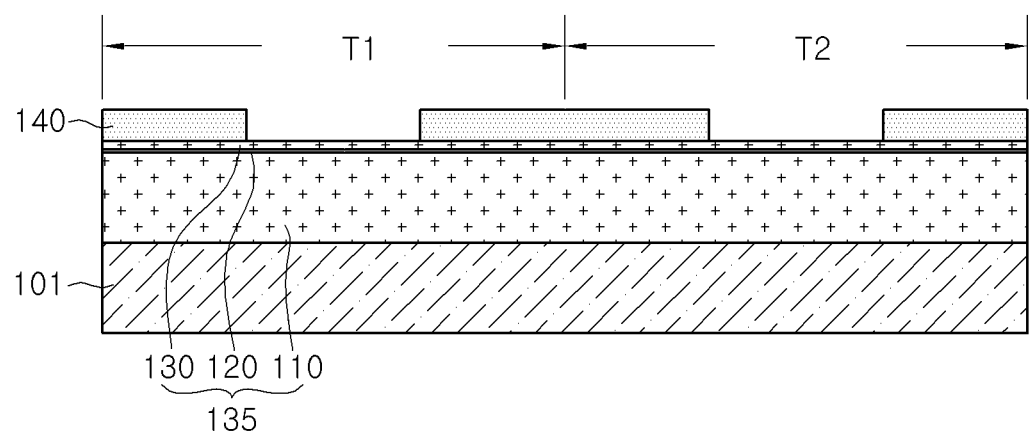

Referring to FIG. 5, a channel layer 140 may be formed around a chip boundary region on the light emitting structure 135, particularly, the first conductive type semiconductor layer 130, i.e., a boundary region between a first chip region T1 and a second chip region T2. The first chip region T1 and the second chip region T2 may be cut later by a scribing process to manufacture unit light emitting devices. Thus, each of the chip regions T1 and T2 may be defined as a region for obtaining a unit light emitting device.

The channel layer 140 may be formed around the boundary region between the first chip region T1 and the second chip region T2 using a mask pattern. Since the drawing is two-dimensionally illustrated, FIG. 5 illustrates a structure in which the channel layer 140 is formed around any one chip region and the entire boundary region between all chip regions contacting the chip region. Thus, when viewed from an upper side, the channel layer 140 may have a ring shape, a loop shape, or a frame shape. The channel layer 140 may be formed using various deposition processes such as a sputtering process, an E-beam deposition process, and a plasma enhanced chemical vapor deposition (PECVD) process.

The channel layer 140 may be formed of a material having insulativity such as $SiO_2$, $Si_xO_y$, $Si_3N_4$, $Si_xN_y$, $SiO_xN_y$, $Al_2O_3$, or $TiO_2$, or a metal material having a superior adhesive force such as Ti, Ni, Pt, Pd, Rh, Ir, or W. Thus, the channel 140 may prevent electrical short circuit from occurring between the light emitting structure 135 and the first electrode 175 or enhance the adhesive force between the light emitting structure 135 and an adhesive layer 170 to improve reliability of a light emitting device 100.

Figure 6:
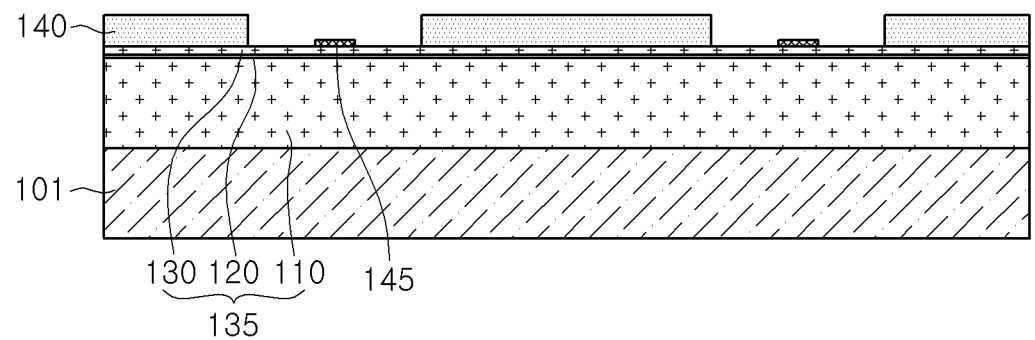

Referring to FIG. 6, a current blocking layer (CBL) 145 may be formed on the first conductive type semiconductor layer 130. The CBL 145 may be formed using a mask pattern. The CBL 145 may be formed on the first conductive type semiconductor layer 130 in which at least portion thereof vertically overlaps with a second electrode 115 that will be formed by a post-process.

The CBL 145 may be formed of a material having conductivity or insulativity less than that of the ohmic contact layer 150 or a material, which short-circuit contacts the first conductive type semiconductor layer 130. The CBL 145 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, Ti, Al, and Cr.

Figure 7:
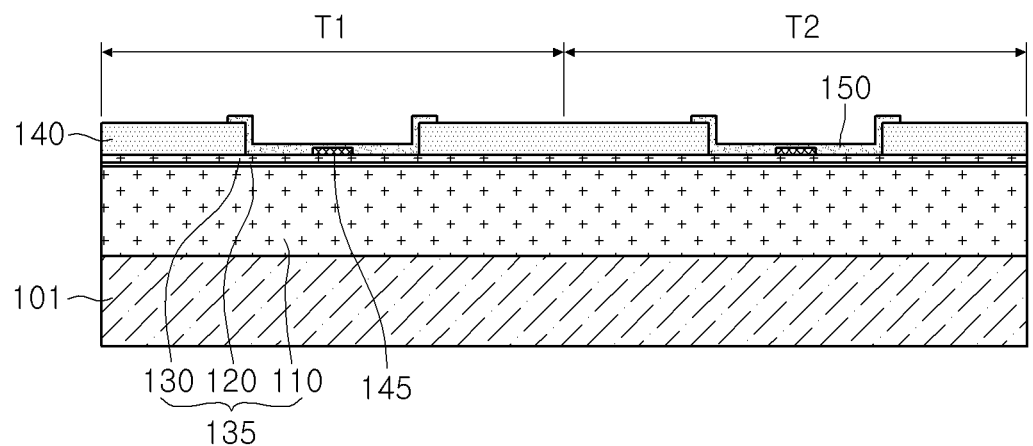
Figure 8:
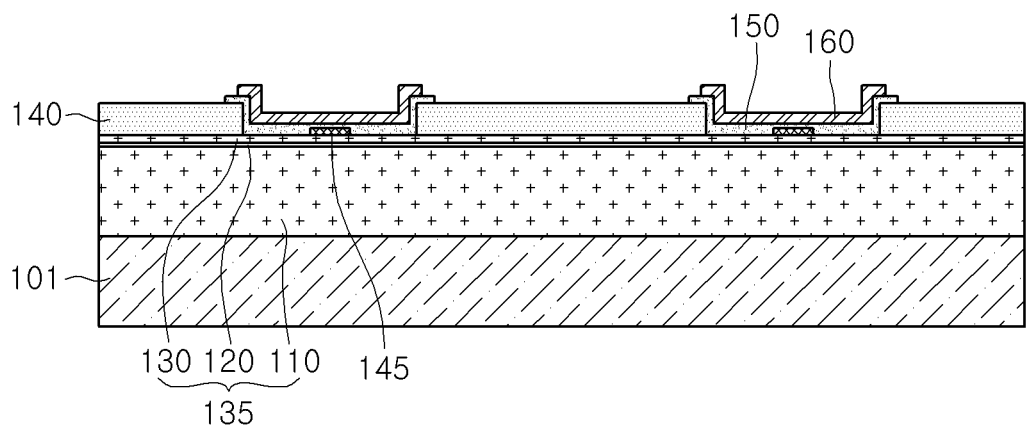

Referring to FIGS. 7 and 8, an ohmic contact layer 150 may be formed on top surfaces of the first conductive type semiconductor layer 130 and the CBL 145 and portions of lateral and top surfaces of the channel layer 140. A reflective layer 160 may be formed on the ohmic contact layer 150.

The ohmic contact layer 150 may be formed of one selected from the transparent conductive materials and the foregoing metals. For example, the ohmic contact layer may have a single- or multi-layered structure, which is formed by using at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

For example, the reflective layer 160 may include at least one selected from the group consisting of Ag, Ni, Al, Rh, Pd, Ir, Ru, Mg, Zn, Pt, Au, and Hf or an alloy thereof, but is not limited thereto. Also, the reflective layer 160 may have a multi-layered structure, which is formed by using the foregoing metals together with transparent conductive materials such as In—ZnO(IZO), Ga—ZnO (GZO), Al—ZnO (AZO), Al—Ga—ZnO (AGZO), In—Ga—ZnO (IGZO), indium zinc tin oxide (IZTO), indium aluminum zinc oxide (IAZO), indium gallium tin oxide (IGTO), or aluminum tin oxide (ATO). That is, for example, the reflective layer 160 may have a multi-layered structure such as IZO/Ni, AZO/Ag, IZO/Ag/Ni, or AZO/Ag/Ni.

For example, each of the ohmic contact layer 150 and the reflective layer 160 may be formed using any one of a sputtering process, an E-beam deposition process, and a plasma enhanced chemical vapor deposition (PECVD) process.

Figure 9:
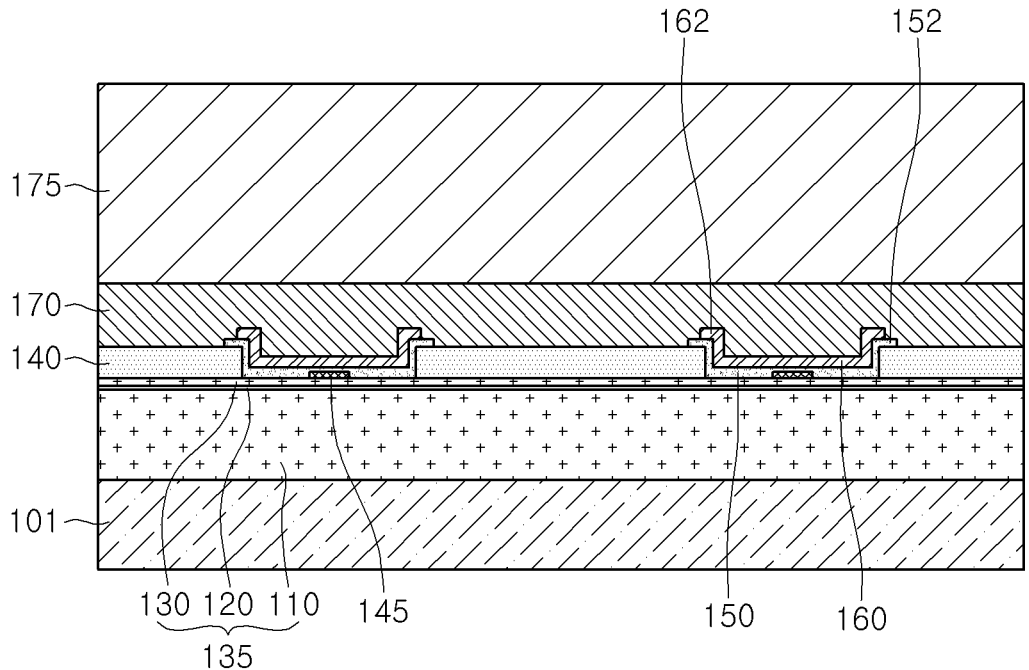
Figure 10:
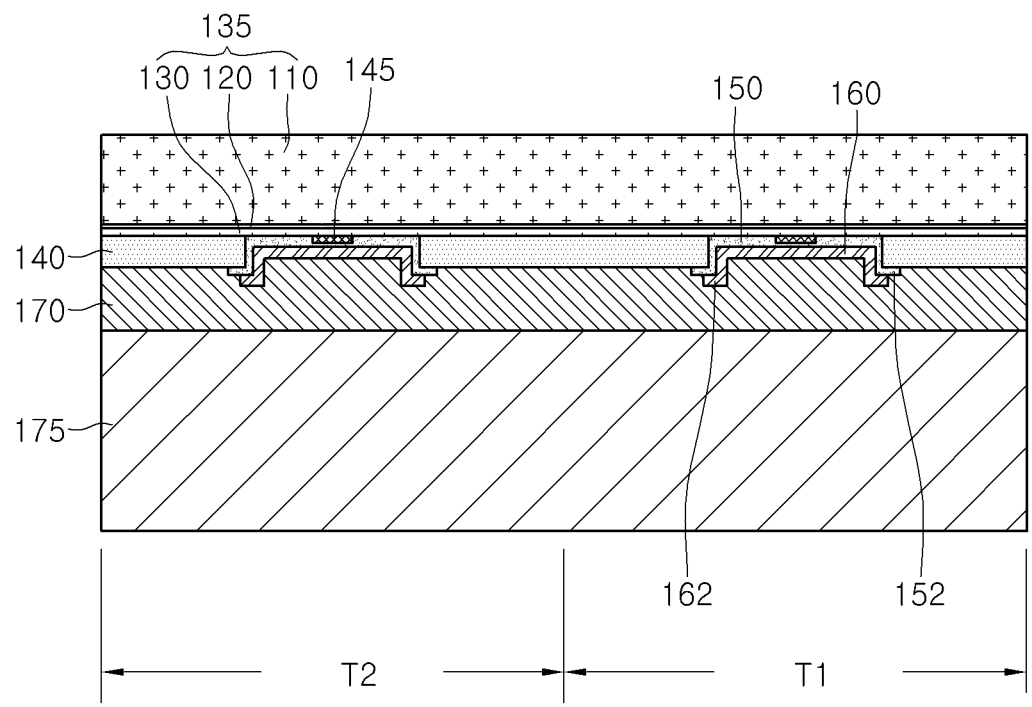

Referring to FIG. 9, the adhesive layer 170 may be formed on the reflective layer 160 and the channel layer 140, and the first electrode 175 may be formed on the adhesive layer 170.

The adhesive layer 170 may be formed of a barrier metal or a bonding metal. For example, the adhesive layer 170 may include at least one selected from the group consisting of Ti, Au, Sn, Ni, Cr, Ga, In, Bi, Cu, Ag, and Ta.

For example, the first electrode 175 may include at least one selected from the group consisting of Ti, Ni, Pt, Au, W, Cu, Mo, Cu-M, and carrier wafers (e.g., Si, Ge, GaAs, ZnO, SiC, and SiGe).

The first electrode 175 may be formed using a plating process or a deposition process, but is not limited thereto.

A separate sheet may be prepared to adhere to the adhesive layer 170 using a bonding process, thereby forming the first electrode 175.

Figure 11:
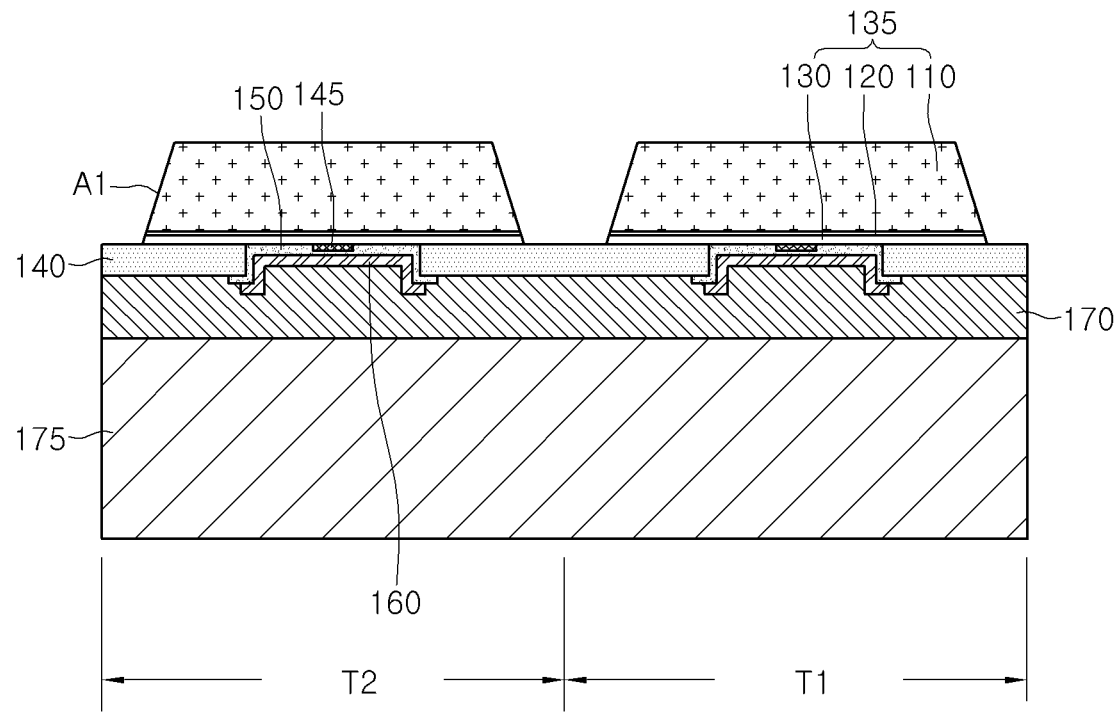

Referring to FIG. 11, the substrate 101 may be turned upside down (180°), and then, the substrate 101 may be removed.

The substrate 101 may be removed by at least one of a laser lift off (LLO) method, a chemical lift off (CLO) method, and a physical polishing method.

According to the LLO method, a laser is concentrately irradiated onto an interface between the substrate 101 and the second conductive type semiconductor layer 110 to separate the substrate 101 from the second conductive type semiconductor layer 110.

According to the LLO method, the substrate 101 is removed so that the second conductive type semiconductor layer 110 is exposed using a wet etch process.

According to the physical polishing method, the substrate 101 is physically polished to sequentially remove the substrate 101 from a top surface thereof so that the second conductive type semiconductor layer 110 is exposed.

After the substrate 101 is removed, a cleaning process may be further performed to remove a residual of the substrate 101 remaining on the top surface of the second conductive type semiconductor layer 110. The cleaning process may include an asking process, which uses a plasma surface treatment or oxygen or nitrogen gas.

Referring to FIG. 11, an isolation etching process may be performed along a boundary region between first and second chip regions T1 and T2 to divide a unit chip region including the light emitting structure 135. The channel layer 140 in the boundary region between the first and second chip regions T1 and T2 may be exposed by the isolation etching process.

For example, the isolation etching process may be performed by a dry etch process such as an inductively coupled plasma (ICP) process.

Figure 12:
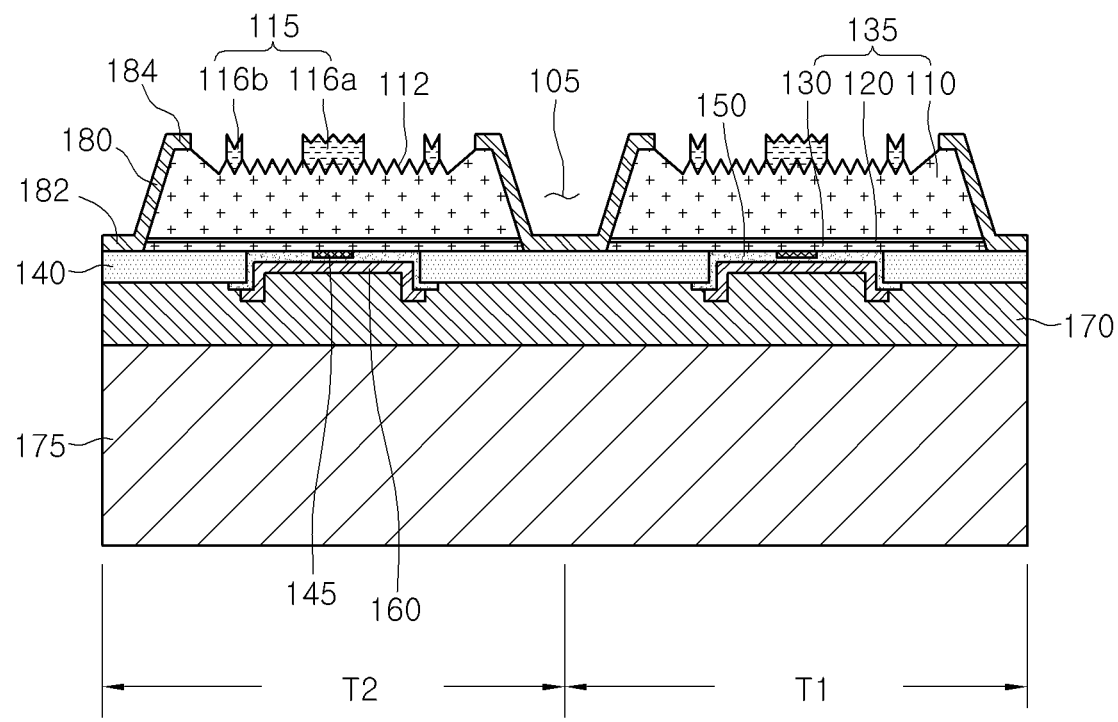

Referring to FIG. 12, a passivation layer 180 may be formed on at least lateral surface of the light emitting structure 135 and the channel layer 140 in the boundary region between the first and second chip regions T1 and T2. That is to say, the passivation layer 180 may contact the top surface of the channel layer 140 in the boundary region between the first and second chip regions T1 and T2. Also, the passivation layer 180 may extend up to the circumference region of the top surface of the second conductive type semiconductor layer 110 by way via or passing through the lateral surfaces of the first conductive type semiconductor layer 130, the active layer 120, and the second conductive type semiconductor layer 110.

The passivation layer 180 may prevent electrical short circuit from occurring between the light emitting structure 135 and a conductive member such as an external electrode. For example, the passivation layer 180 may be formed of a material having insulativity such as $SiO_2$, $SiO_x$, $SiO_xN_y$, $Si_3N_4$, $TiO_2$, or $Al_2O_3$, but is not limited thereto.

The passivation layer 180 may be formed by a deposition process such as an E-beam deposition process, a PECVD process, or a sputtering process.

A roughness or unevenness 112 may be formed on the top surface of the second conductive type semiconductor layer 110 exposed by the passivation layer 180 to improve light extraction efficiency.

A dry or wet etch process may be performed using the passivation layer 180 as a mask to form the roughness or unevenness 112. Any roughness or unevenness is not formed on the second conductive type semiconductor layer 110 below the passivation layer 180 by the passivation layer 180.

Although a process of forming the roughness or unevenness on the second conductive type semiconductor layer 110 after the passivation layer 180 is formed in FIG. 12, the roughness or unevenness may be formed on the second conductive type semiconductor layer 110 before the passivation layer 180 is formed. In this case, the roughness or unevenness may be formed on the entire lateral surfaces of the second conductive type semiconductor layer 110, the active layer 120, and the first conductive type semiconductor layer 130 as well as the top surface of the second conductive type semiconductor layer 110.

Embodiments are not limited to a given order of forming the passivation layer 180 and the roughness or unevenness 112 formed on the second conductive type semiconductor layer 110.

A second electrode may be formed on the second conductive type semiconductor layer 110 including the roughness or unevenness 112.

The second electrode 115 may include an electrode pad region 116a to which a wire is bonded and a current spreading pattern 116b, which spreads current to uniformly supply the current into the entire region of the light emitting structure 135 by being branched into at least one or more sides from the electrode pad region 116a.

The electrode pad region 116a may have a square shape, a circular shape, an oval shape, or a polygonal shape, but is not limited thereto.

The second electrode 115 may have a single- or multi-layered structure including at least one selected from the group consisting of Au, Ti, Ni, Cu, Al, Cr, Ag, and Pt.

The second electrode 115 may be formed using a plating process or a deposition process.

Figure 13:
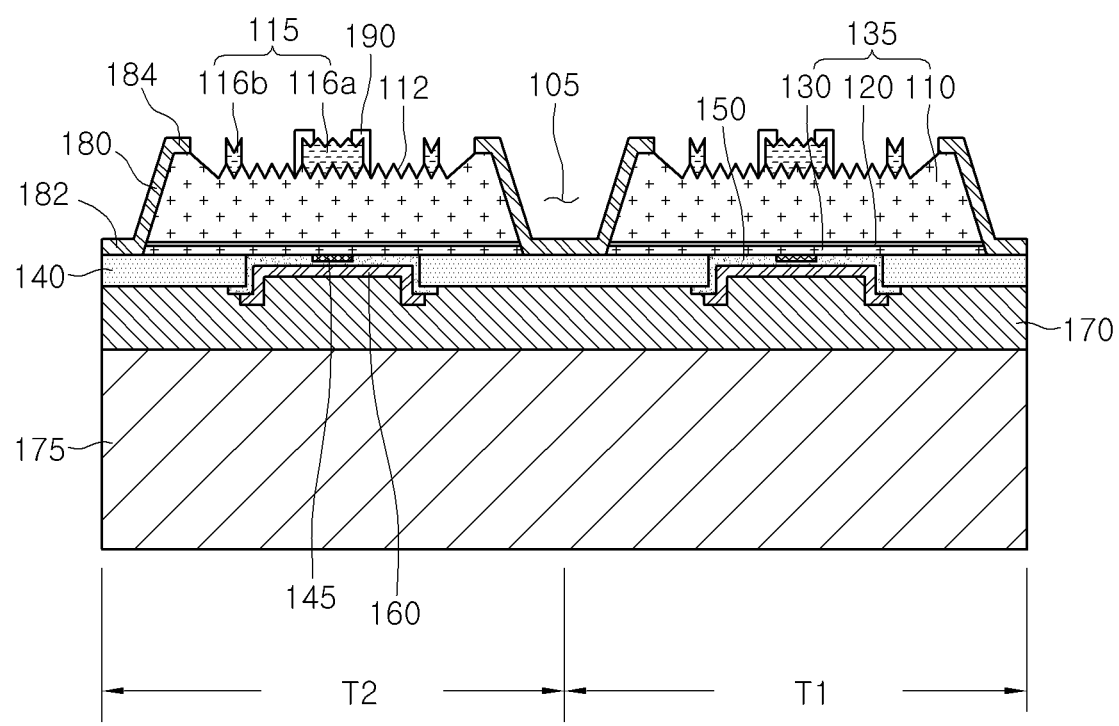

Referring to FIG. 13, a reflective member 190 may be formed on at least lateral surface of the second electrode 115.

The reflective member 190 may be formed on the entire region of the lateral surface and the circumference region of the top surface of the second electrode 115, particularly, the electrode pad region 116a.

For example, the reflective member 190 may be formed of at least one or two or more alloys of Ag, Ni, Al, Rh, Pd, Ir, Ru, Mg, Zn, Pt, Au, and Hf.

The reflective member 190 may be formed by the deposition process such as the E-beam deposition process, the PECVD process, or the sputtering process or may be formed by the plating process.

The reflective member 190 may be formed after a mask is formed on the light emitting structure 135. In this case, it may prevent the light emitting structure 135 from being damaged by the process of manufacturing the reflective member 190.

Also, in case where the adhesive layer 195 is formed between the reflective member 190 and the second electrode 115 (refer to FIG. 3B), the adhesive layer 195 may be formed on at least one lateral surface of the second electrode 115 before the reflective member 190 is formed.

Figure 14:
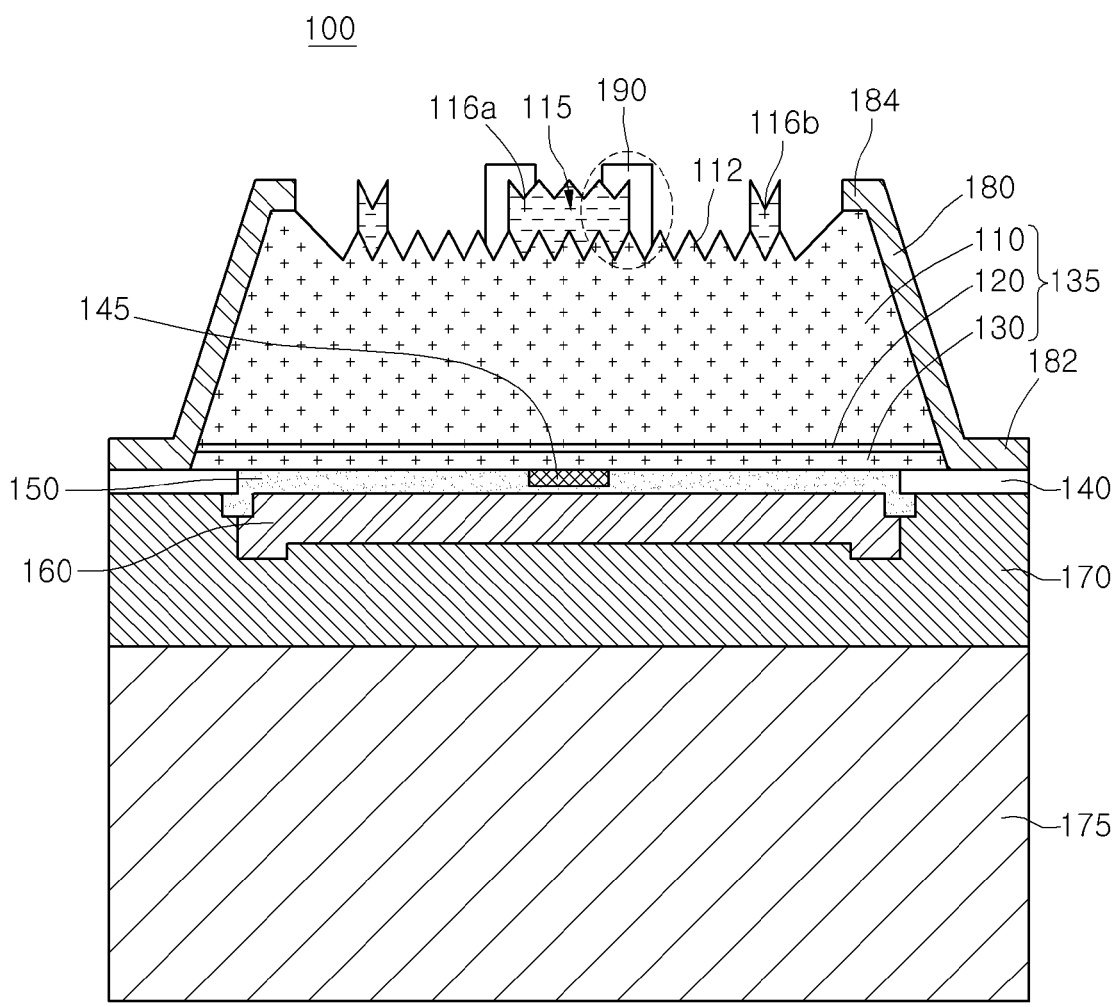

Referring to FIG. 14, a chip separation process may be performed to cut the boundary region between the first and second chip regions T1 and T2. As a result, since a plurality of chips is divided into individual chip units, the light emitting device 100 according to an embodiment may be manufactured.

For example, the chip separation process may include a breaking process in which a physical force using a blade is applied to separate the chips, a laser scribing process in which a laser is irradiated onto a boundary between the chips to separate the chips, and an etch process including a wet or dry etch process, but is not limited thereto.

Figure 15:
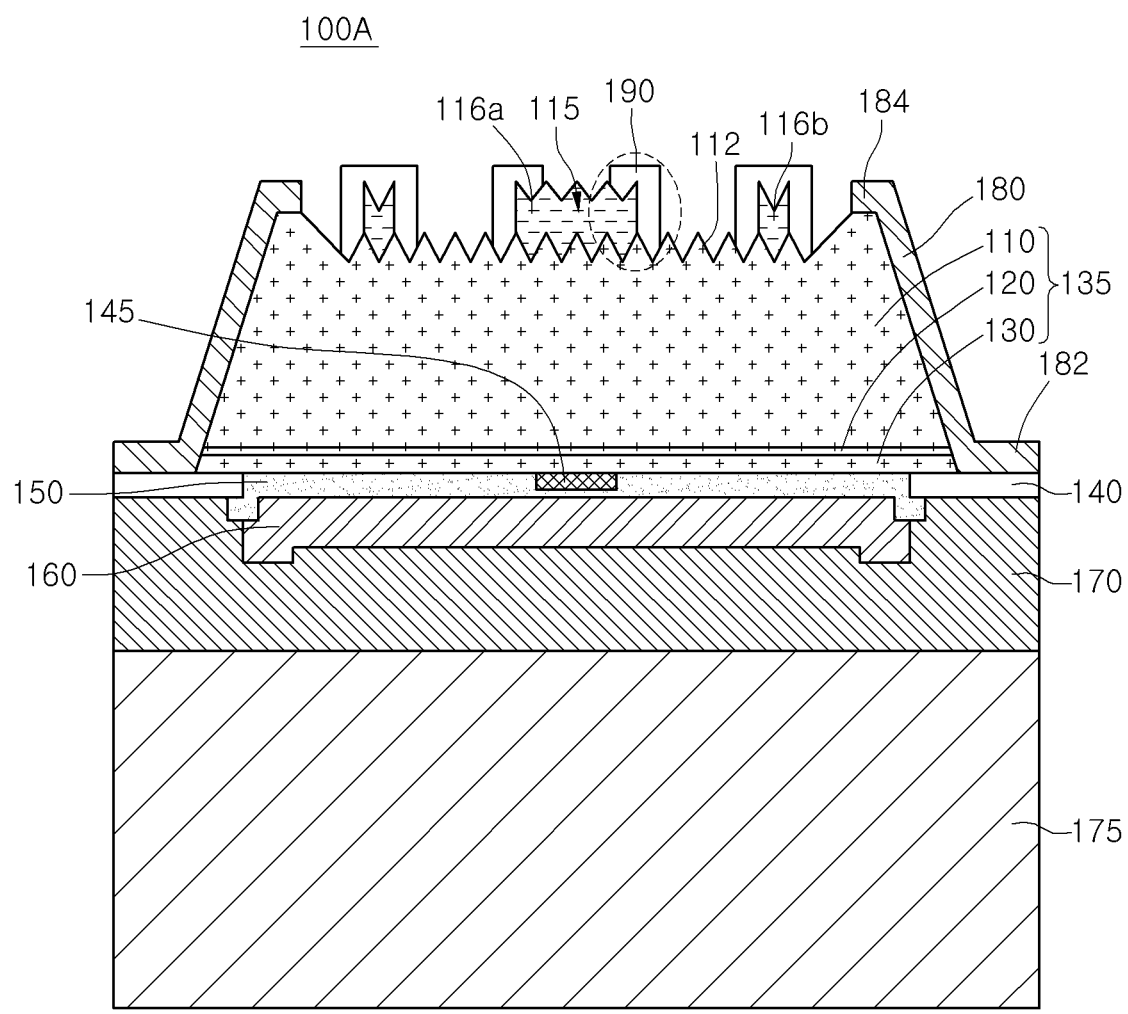
FIG. 15 is a side sectional view of a light emitting device according to a second embodiment.
Figure 16:
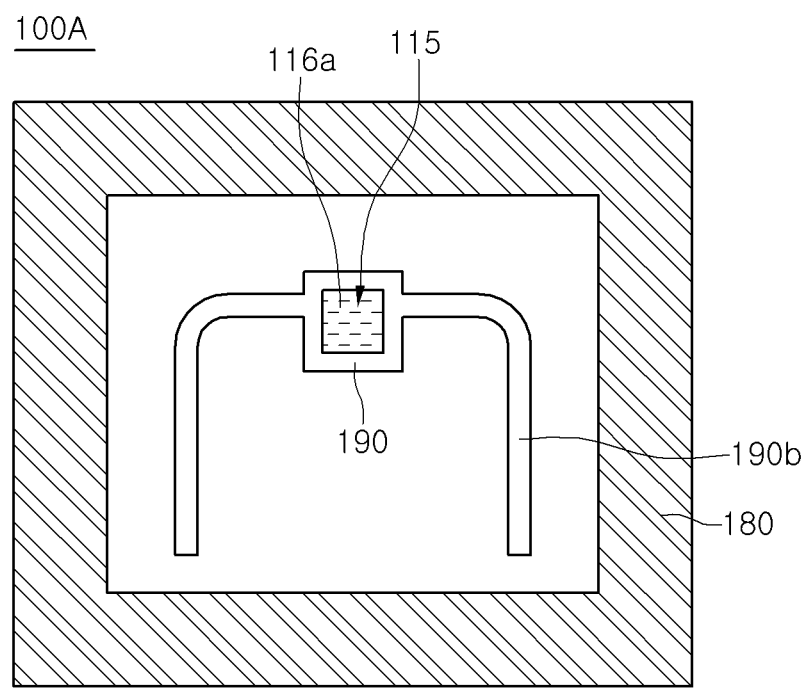
FIG. 16 is a plan view illustrating the light emitting device of FIG. 15.

FIG. 15 is a side sectional view of a light emitting device according to a second embodiment, and FIG. 16 is a plan view illustrating the light emitting device of FIG. 15.

A second embodiment is equal or similar to the first embodiment except that a reflective member 190 is disposed on at least lateral surface of an electrode pad region 116a of a second electrode 115 as well as on the entire surface of a current spreading pattern 116b except an under surface of the current spreading pattern 116b of the second electrode 115.

Thus, equivalent parts of the second embodiment are given the same term or reference number as in the first embodiment.

In addition, the same contents as those of the first embodiment will not be described in detail in the second embodiment. The contents, which are not described in the second embodiment, may be easily understood from the first embodiment.

Referring to FIGS. 15 and 16, in a light emitting device 100A according to the second embodiment, the reflective member 190 may be disposed on at least lateral surface of the electrode pad region 116a of the second electrode 115 as well as on the entire surface of the current spreading pattern 116b except the under surface of the current spreading pattern 116b of the second electrode 115.

That is to say, the reflective member 190 may cover a top surface and both lateral surfaces of the current spreading pattern 116b.

According to the second embodiment, the reflective member 190 may be further disposed on the entire surface of the current spreading pattern 116b except the under surface of the current spreading pattern 116b. Thus, since light extracted through a second conductive type semiconductor layer 110 is totally reflected by the reflective member 190 disposed on the at least lateral surface of the current spreading pattern 116b, light losses may be minimized when compared to that of the first embodiment and light extraction efficiency may be improved.

Figure 17:
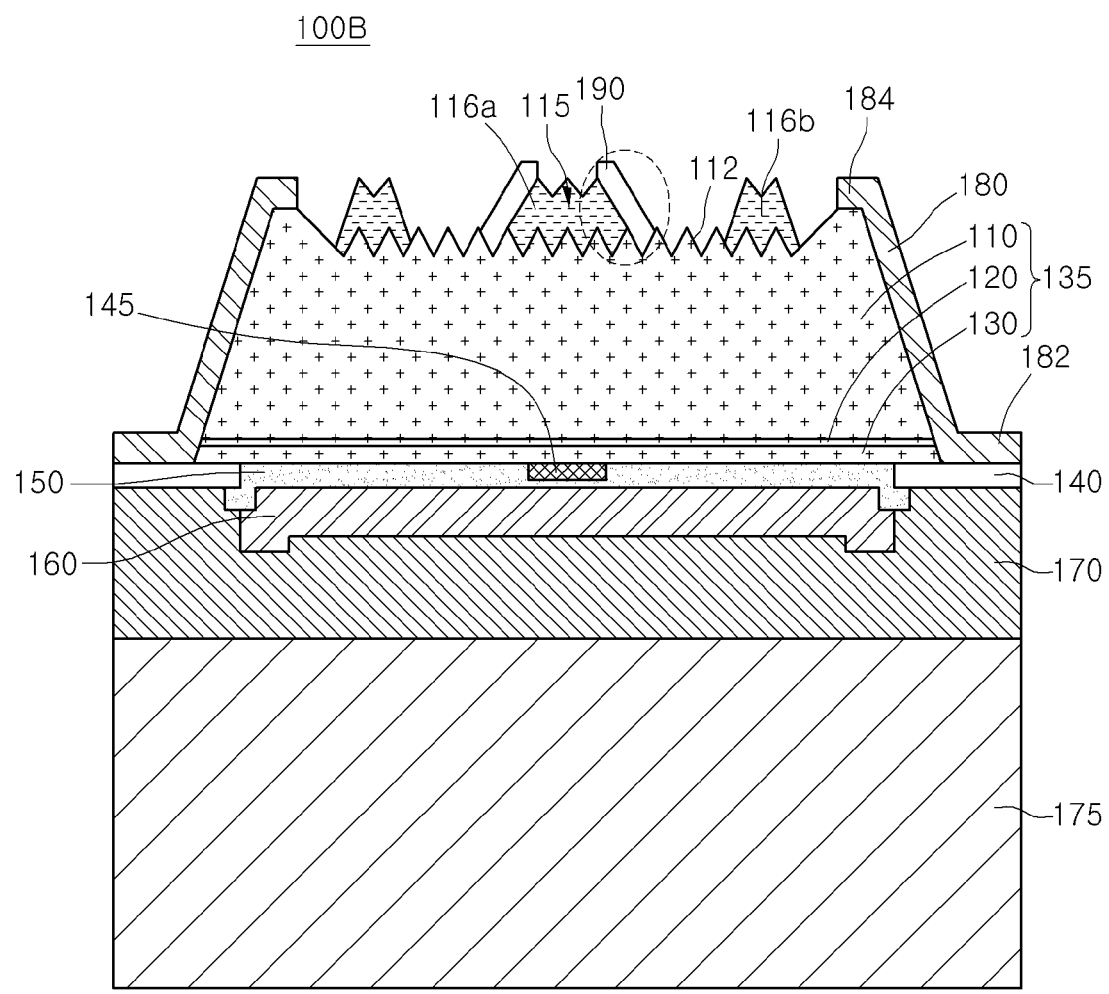
FIG. 17 is a side sectional view of a light emitting device according to a third embodiment.

FIG. 17 is a side sectional view of a light emitting device according to a third embodiment.

A third embodiment is equal or similar to the first embodiment except that a second electrode 115 has an inclined lateral surface, and also a reflective member 190 disposed on the lateral surface of the second electrode 115 is inclinedly disposed on the lateral surface of the second electrode 115.

Thus, equivalent parts of the third embodiment are given the same term or reference number as in the first embodiment.

In addition, the same contents as those of the first embodiment will not be described in detail in the third embodiment. The contents, which are not described in the third embodiment, may be easily understood from the first embodiment.

Referring to FIG. 17, in a light emitting device 100B according to the third embodiment, the second electrode 115 may have an inclined lateral surface. That is, the second electrode 115 may have an under surface having a width greater than that of a top surface thereof.

Similarly, since the second electrode 115 has the inclined lateral surface, the reflective member 190 disposed on the lateral surface of the second electrode 115 may also have an inclined surface equal or similar to that of the second electrode 115.

In addition, the reflective member 190 may be disposed around a circumference region of the top surface of the second electrode 115, like the first embodiment. Also, the reflective member 190 may contact a second conductive type semiconductor layer 110 or may be spaced from the second conductive type semiconductor layer 110.

Thus, since the reflective member 190 has the inclined lateral surface, light extracted through the second conductive type semiconductor layer 110 may be reflected by the inclined surface of the reflective member 190 to improve light extraction efficiency.

Figure 18:
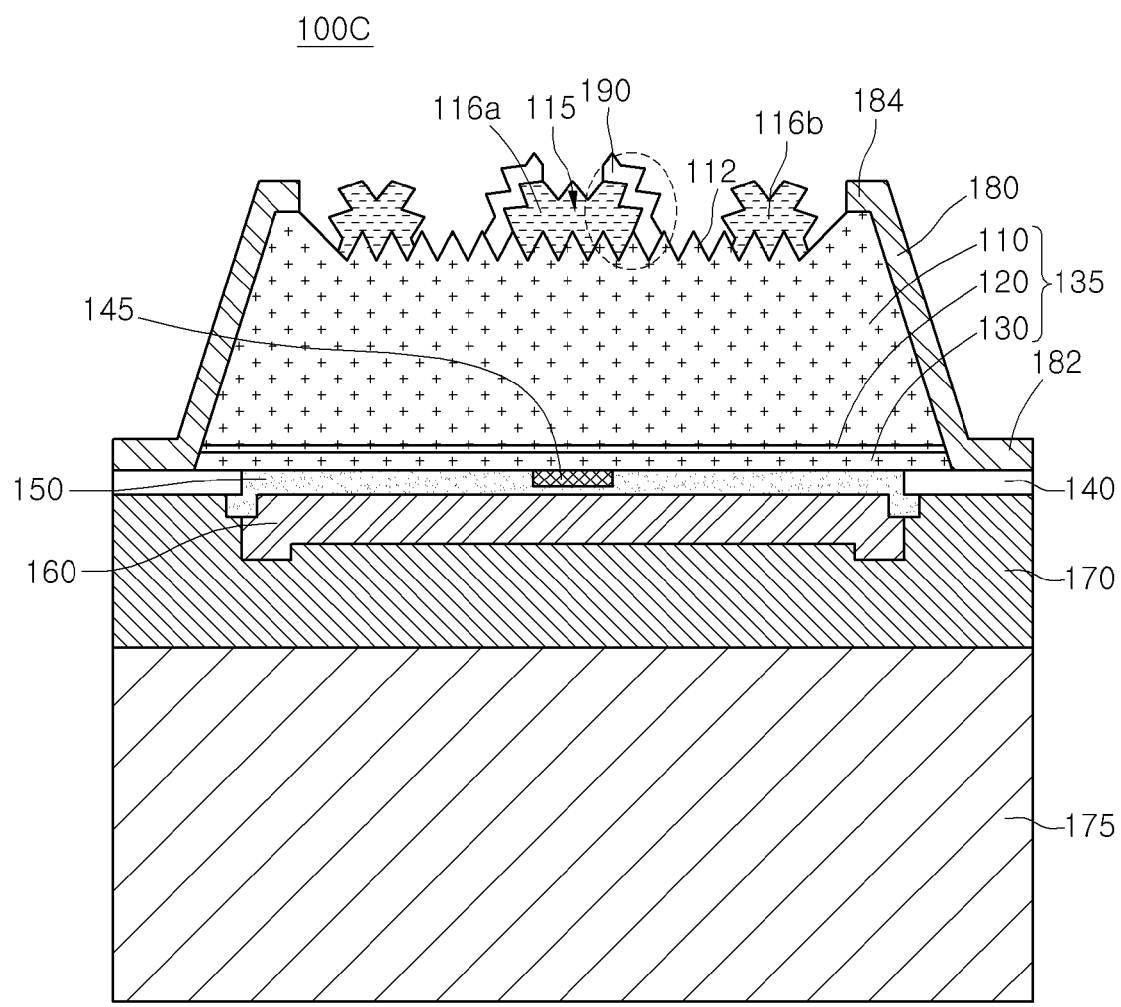
FIG. 18 is a side sectional view of a light emitting device according to a fourth embodiment.

FIG. 18 is a side sectional view of a light emitting device according to a fourth embodiment.

A fourth embodiment is equal or similar to the third embodiment except that a roughness or unevenness is disposed on each of lateral surfaces of a second electrode 115 and a reflective member 190.

Thus, equivalent parts of the fourth embodiment are given the same term or reference number as in the third embodiment.

In addition, the same contents as those of the first and third embodiments will not be described in detail in the fourth embodiment. The contents, which are not described in the fourth embodiment, may be easily understood from the first and third embodiments.

Referring to FIG. 18, in a light emitting device 100C according to the fourth embodiment, the second electrode 115 may have an inclined lateral surface. Also, the roughness or unevenness may be disposed on each of top and lateral surfaces of the second electrode 115.

The second electrode 115 may have an under surface having a width greater than that of the top surface thereof.

In addition, the second electrode 115 may have the inclined lateral surface, and also, the roughness or unevenness may be disposed on the inclined lateral surface of the second electrode 115.

Similarly, since the second electrode 115 has the inclined lateral surface and the roughness or unevenness is disposed on the inclined lateral surface of the second electrode 115, the reflective member 190 disposed on the lateral surface of the second electrode 115 may also have a roughness or unevenness equal or similar to that of the second electrode 115.

Thus, since the reflective member 190 has the inclined lateral surface, light extracted through a second conductive type semiconductor layer 110 may be reflected by the inclined surface of the reflective member 190 to improve light extraction efficiency. Also, since the roughness or unevenness may be disposed on the lateral surface of the reflective member 190, the light extracted through the second conductive type semiconductor layer 110 may be randomly reflected by the roughness or unevenness of the reflective member 190. As a result, the light may uniformly proceed in all directions of a light emitting structure 135 to improve light uniformity.

Figure 19:
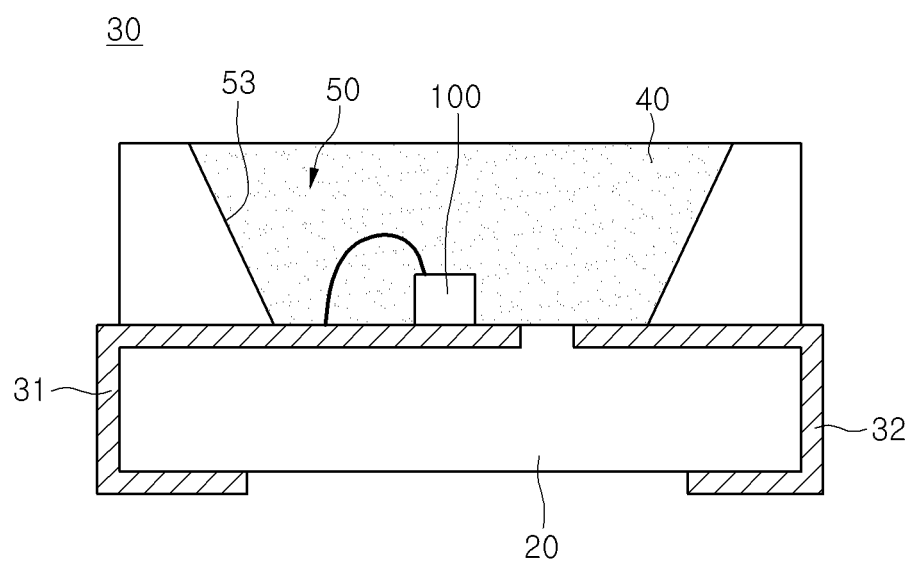
FIG. 19 is a sectional view of a light emitting device package including a light emitting device according to an embodiment.

FIG. 19 is a sectional view of a light emitting device package including a light emitting device according to an embodiment.

Referring to FIG. 19, a light emitting device package 30 according to an embodiment includes a body part 20, first and second electrode layers 31 and 32 disposed on the body part 20, a light emitting device 1 disposed on the body part 20 and electrically connected to the first and second electrode layers 31 and 32, and a molding member 40 surrounding the light emitting device 1 on the body part 20.

The body part 20 may be formed of a silicon material, a synthetic resin material, or a metal material. Also, when viewed from an upper side, the body part 20 has a cavity 50 therein, and the cavity 50 has an inclined surface 53.

The first electrode layer 31 and the second electrode layer 32 may be electrically separated from each other and pass through the inside of the body part 20. That is, each of the first and second electrode layers 31 and 32 has one end disposed inside the cavity 50 and the other end attached to an outer surface of the body part 20 and exposed to the outside.

The first and second electrode layers 31 and 32 may provide power to the light emitting device 1. Also, the first and second electrode layers 31 and 32 may reflect light generated in the light emitting device 1 to improve light efficiency. In addition, the first and second electrode layers 31 and 32 may discharge heat generated in the light emitting device 1 to the outside.

The light emitting device 1 may be disposed on the body part 20 or the first or second electrode layer 31 or 32.

First and second wires 171 and 181 of the light emitting device 1 may be electrically connected to one of the first and second electrode layers 31 and 32, but is not limited thereto.

The molding member 40 may surround the light emitting device 1 to protect the light emitting device 1. Also, a phosphor may be contained in the molding member 40 to change a wavelength of light emitted from the light emitting device 1.

The light emitting device or the light emitting device package according to an embodiment may be applied to a light unit. The light unit has a structure in which a plurality of light emitting devices or light emitting device packages is arrayed. Thus, the light unit may include a display device illustrated in FIGS. 20 and 21 and a lighting device illustrate in FIG. 22. In addition, the light unit may include illumination lamps, traffic lights, vehicle headlights, and signs.

Figure 20:
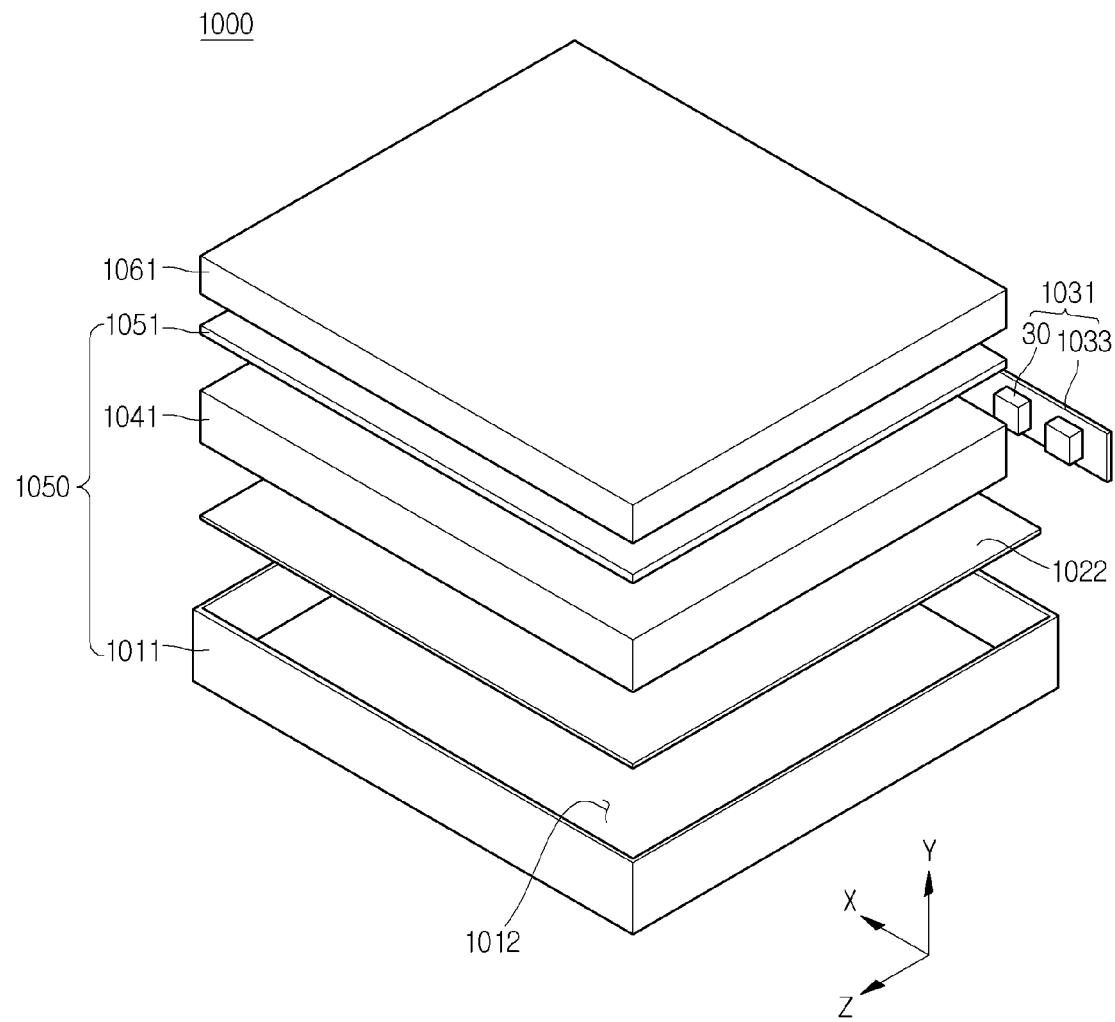
FIG. 20 is an exploded perspective view of a display device according to am embodiment.

FIG. 20 is an exploded perspective view of a display device according to am embodiment.

Referring to FIG. 20, a display unit 1000 may include a light guide plate 1041, a light emitting module 1031 providing light to the light guide plate 1041, a reflective member 1022 below the light guide plate 1041, an optical sheet 1051 above the light guide plate 1041, a display panel 1061 above the optical sheet 1051, and a bottom cover 1011 receiving the light guide plate 1031, the light emitting module 1031, and the reflective member 1022, but is not limited thereto.

The bottom cover 1011, the reflective member 1022, the light guide plate 1041 may be defined as the light unit 1050.

The light guide plate 1041 diffuses light supplied from the light emitting module 1031 to produce planar light. The light guide plate 1041 may be formed of a transparent material. For example, the light guide plate 1041 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 is disposed on at least one lateral surface of the light guide plate 1041 to provide light to the at least one lateral surface of the light guide plate 1041. Thus, the light emitting module 1031 may be used as a light source of a display device.

At least one light emitting module 1031 may be disposed on one lateral surface of the light guide plate 1041 to directly or indirectly provide light. The light emitting module 1031 may include a substrate 1033 and the light emitting device packages 30 according to the embodiment. The light emitting device packages 30 may be arrayed by a predetermined distance on the substrate 1033. The substrate 1033 may be a printed circuit board (PCB), but is not limited thereto. Also, the substrate 1033 may include a metal core PCB or a flexible PCB, but is not limited thereto. When the light emitting device packages 30 are mounted on a lateral surface of the bottom cover 1011 or on a heatsink plate, the substrate 1033 may be removed. Here, a portion of the heatsink plate may contact a top surface of the bottom cover 1011. Thus, heat generated in the light emitting device package 30 may be discharged into the bottom cover 1011 via the heatsink plate.

The plurality of light emitting device packages 30 may be mounted to allow a light emitting surface through which light is emitted onto the substrate 1033 to be spaced a predetermined distance from the light guide plate 1041, but is not limited thereto. The light emitting device packages 30 may directly or indirectly provide light to a light incident surface that is a side of the light guide plate 1041, but is not limited thereto.

The reflective member 1022 may be disposed below the light guide plate 1041. Since the reflective member 1022 reflects light incident onto an under surface of the light guide plate 1041 to supply the light to the display panel 1061, brightness of the display panel 1061 may be improved. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with an opened upper side, but is not limited thereto. The bottom cover 1011 may be coupled to a top cover (not shown), but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel, and include first and second substrates formed of a transparent material and a liquid crystal layer between the first and second substrates. A polarizing plate may be attached to at least one surface of the display panel 1061. The present disclosure is not limited to the attached structure of the polarizing plate. The display panel 1061 transmits or blocks light provided from the light emitting module 1031 to display information. The display unit 1000 may be applied to various portable terminals, a monitor for a notebook computer, a monitor for a laptop computer, television, etc.

The optical sheet 1051 is disposed between the display panel 1061 and the light guide plate 1041 and includes at least one transmission sheet. For example, the optical sheet 1051 may include at least one of a diffusion sheet, a horizontal or vertical prism sheet, a brightness enhanced sheet, etc. The diffusion sheet diffuses incident light, and the horizontal or/and vertical prism sheet collects the incident light into a display region. In addition, the brightness enhanced sheet reuses lost light to improve the brightness. Also, a protection sheet may be disposed on the display panel 1061, but is not limited thereto.

Optical members such as the light guide plate 1041 and the optical sheet 1051 may be disposed on an optical path of the light emitting module 1031, but is not limited thereto.

Figure 21:
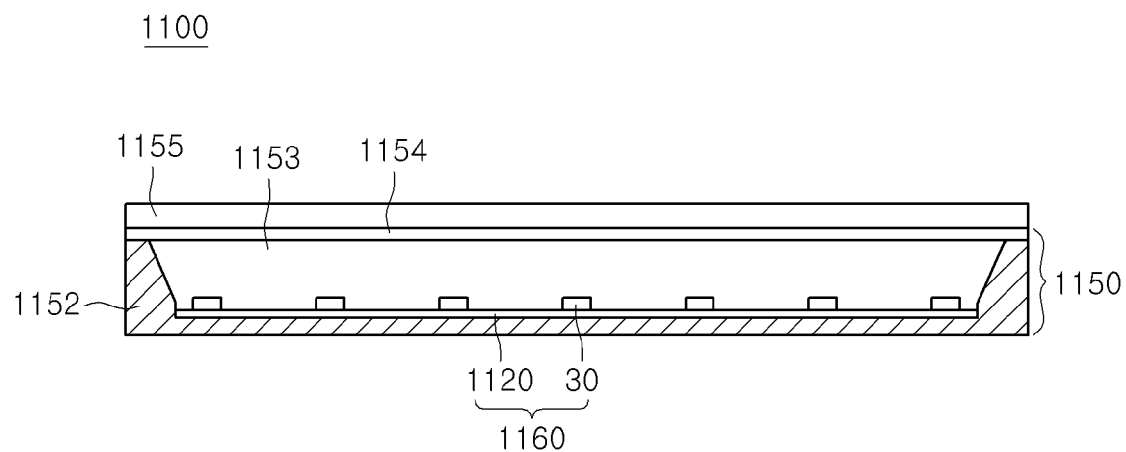
FIG. 21 is a view of a display device according to an embodiment.

FIG. 21 is a view of a display device according to an embodiment.

Referring to FIG. 21, a display unit 1100 includes a bottom cover 1152, a substrate 1120 on which the above-described light emitting device packages 30 are arrayed, an optical member 1154, and a display panel 1155.

The substrate 1120 and the light emitting device package 30 may be defined as a light emitting module 1060. The bottom cover 1152, the at least one light emitting module 1060, and the optical member 1154 may be defined as a lighting unit.

The bottom cover 1152 may include a receiving part 1153, but is not limited thereto.

The optical member 1154 may include at least one of a lens, a light guide plate, a diffusion sheet, horizontal and vertical prism sheets, and a bright enhancement sheet. The light guide plate may be formed of a PC material or PMMA material. In this case, the light guide plate may be removed. The diffusion sheet diffuses incident light, and the horizontal and vertical prism sheets collect the incident light into the display panel 1155. The brightness enhanced sheet reuses lost light to improve brightness.

The optical member 1154 is disposed on the light emitting module 1060 to produce planar light using the light emitted from the light emitting module 1060 or diffuse and collect the light emitted from the light emitting module 1060.

Figure 22:
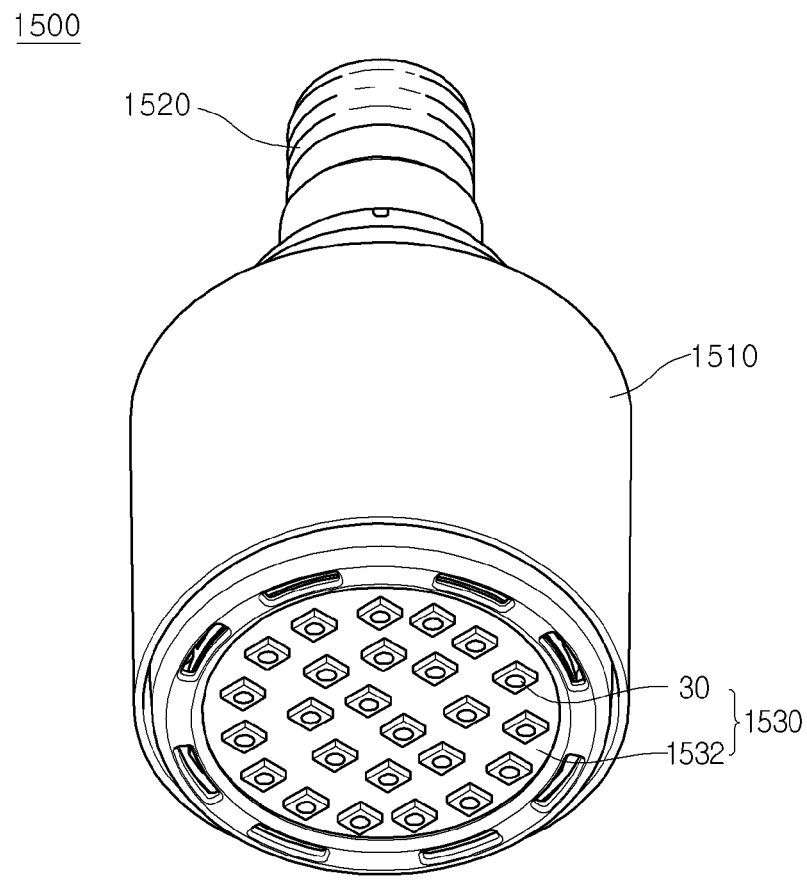
FIG. 22 is a perspective view of a lighting device according to an embodiment.

FIG. 22 is a perspective view of a lighting device according to an embodiment.

Referring to FIG. 22, the lighting unit 1500 may include a case 1510, a light emitting module 1530 in the case 1510, and a connection terminal 1520 disposed in the case 1510 to receive an electric power from an external power source.

The case 1510 may be preferably formed of a material having good heat shielding characteristics, for example, a metal material or a resin material.

The light emitting module 1530 may include a substrate 1532 and a light emitting device package 30 mounted on the substrate 1532. The light emitting device package 30 may be provided in plurality, and the plurality of light emitting device packages 30 may be arrayed in a matrix shape or spaced a predetermined distance from each other.

The substrate 1532 may be an insulator substrate on which a circuit pattern is printed. For example, the substrate may include a general printed circuit board (PCB), a metal core PCB, a flexible PCB, a ceramic PCB, FR-4, etc.

Also, the substrate 1532 may be formed of a material to efficiently reflect light, and a surface thereof may be formed in a color capable of efficiently reflecting light. For example, the substrate may be a coated layer having a white color or a silver color.

The at least one light emitting device packages 30 may be mounted on the substrate 1532. Each of the light emitting device packages 30 may include at least one light emitting diode (LED) chip. The LED chip may include a color LED emitting red, green, blue or white light, and a UV LED emitting ultraviolet (UV) rays.

The light emitting module 1530 may have a combination of several light emitting device packages 30 to obtain desired color and luminance. For example, the light emitting module 1530 may have a combination of a white LED, a red LED, and a green LED to obtain a high color rendering index (CRI).

The connection terminal 1520 may be electrically connected to the light emitting module 1530 to supply a power. The connection terminal 1520 may be screwed and coupled to an external power source in a socket type, but is not limited thereto. For example, the connection terminal 1520 may be made in a pin type and inserted into an external power source, or may be connected to the external power source through a wire.

According to the embodiments, in the method of manufacturing the light emitting device, the first electrode is prepared, and the light emitting structure including the first semiconductor layer, the active layer, and the second semiconductor layer are disposed on the first electrode. Also, the second electrode is disposed on the light emitting structure, and the reflective member is disposed on the at least lateral surface of the second electrode.

According to the embodiments, since the reflective member is disposed on the at least lateral surface of the second electrode, the light extracted through the light emitting structure may be reflected by the reflective member to improve the light extraction efficiency of the light emitting device.

According to the embodiments, the second electrode includes the electrode pad region and the current spreading patterns, which are branched into at least one or more sides from the electrode pad region. Here, since the reflective member is disposed on the at least lateral surface of the electrode pad region, the light extracted through the light emitting structure may be reflected by the electrode pad region to improve the light extraction efficiency of the light emitting device.

According to the embodiments, since the adhesive layer is disposed between the second electrode and the reflective member, the reflective member may further strongly adhere to the second electrode by the adhesive layer.

According to the embodiments, since the reflective member is disposed on at least lateral surface of each of the current spreading patterns, the light extracted through the light emitting structure may be reflected by the electrode pad region as well as the current spreading patterns to significantly improve the light extraction efficiency.

According to the embodiments, since the lateral surface of the electrode has the inclined surface and the unevenness, the light extracted through the light emitting structure may be randomly reflected by the unevenness to realize more uniform light.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a metal layer;
   a light emitting structure comprising a first conductive type semiconductor layer, an active layer, and a second conductive type semiconductor layer;
   an electrode on a first upper portion of the second conductive type semiconductor layer;
   a current spreading portion on a second upper portion of the second conductive type semiconductor layer;
   an adhesive layer under the first conductive type semiconductor layer;
   an insulating layer between the electrode and the adhesive layer;
   a passivation layer on an inclined surface of the light emitting structure and on at least one upper surface of the light emitting structure; and
   a reflective layer between the metal layer and the first conductive type semiconductor layer;
   wherein the electrode has a first layer including Au,
   wherein the electrode contacts the current spreading portion,
   wherein an upper surface of the electrode has a first roughness,
   wherein an upper surface of the second conductive type semiconductor layer has a second roughness, and
   wherein the current spreading portion has an inclined surface.

2. The light emitting device of claim 1, wherein the electrode further comprises a second layer including Cr and a third layer including Pt.

3. The light emitting device of claim 2, wherein the first layer of the electrode is on the second layer and the third layer is between the first layer and the second layer.

4. The light emitting device of claim 1, wherein the electrode has a thickness of about 1 µm to about 10 µm.

5. The light emitting device of claim 1, wherein a portion of the insulating layer vertically overlaps with the electrode and the reflective layer.

6. The light emitting device of claim 1, wherein the insulating layer comprises a material selected from the group consisting of ITO, IZO, IZTO, IAZO, IGZO, IGTO, AZO, ATO, ZnO, SiO2, SiOx, SiOxNy, $Si_3N_4$, $Al_2O_3$, TiOx, Ti, Al, and Cr.

7. The light emitting device of claim 1, wherein the electrode has an inclined lateral surface.

8. The light emitting device of claim 7, wherein the inclined lateral surface of the electrode has a third roughness.

9. The light emitting device of claim 1, wherein the adhesive layer includes a material selected from the group consisting of Ti, Au, Sn, Ni, Cr, Ga, In, Bi, Cu, Ag, and Ta.

10. The light emitting device of claim 1, wherein the passivation layer contacts the first conductive type semiconductor layer, the active layer, and the second conductive type semiconductor layer.

11. The light emitting device of claim 1, wherein an upper surface of the current spreading portion has a fourth roughness.

12. The light emitting device of claim 1, wherein the inclined surface of the current spreading portion has a fifth roughness.

13. The light emitting device of claim 1, wherein the insulating layer directly contacts the light emitting structure.

14. The light emitting device of claim 1, wherein the second roughness has a concave and a convex shape with inclined surfaces, which are met at an apex thereof.

15. The light emitting device of claim 1, wherein an area of the second upper portion is greater than an area of the first upper portion.

16. The light emitting device of claim 1, wherein the reflective layer has a shape corresponding to a shape of the electrode.

17. A light emitting device, comprising:
    a metal layer;
    an adhesive layer on the metal layer;
    a light emitting structure comprising a first conductive type semiconductor layer, an active layer, and a second conductive type semiconductor layer on the adhesive layer;
    an electrode on the light emitting structure;
    an insulating layer between the electrode and the adhesive layer;
    a current spreading portion on the second conductive type semiconductor layer; and
    a passivation layer on an inclined surface of the light emitting structure and an upper surface portion of the light emitting structure;
    wherein the electrode comprises a first layer including Au, a second layer including Cr, and a third layer including Pt,
    wherein the electrode contacts the current spreading portion,
    wherein an upper surface of the electrode has a first roughness,
    wherein an upper surface of the second conductive type semiconductor layer has a second roughness, and
    wherein the current spreading portion has an inclined surface.

18. The light emitting device of claim 17, wherein the electrode has a thickness of about 1 µm to about 10 µm.

19. The light emitting device of claim 17, wherein an upper surface of the current spreading portion has a second roughness.

20. The light emitting device of claim 17, wherein the first layer of the electrode is on the second layer and the third layer is between the first layer and the second layer.

21. The light emitting device of claim 17, wherein the electrode has an inclined lateral surface and the inclined lateral surface of the electrode has a third roughness.

22. The light emitting device of claim 17, wherein a portion of the insulating layer vertically overlaps with the electrode and the adhesive layer.

23. The light emitting device of claim 17, wherein the second roughness has a concave and a convex shape with inclined surfaces, which are met at an apex thereof.

24. The light emitting device of claim 17, wherein the electrode is on a first upper portion of the second conductive type semiconductor layer and the current spreading portion is on a second upper portion of the second conductive type semiconductor layer; and
    wherein an area of the second upper portion is greater than an area of the first upper portion.

25. The light emitting device of claim 17, further including a reflective layer.

26. The light emitting device of claim 25, wherein the reflective layer has a shape corresponding to a shape of the electrode.

27. A light emitting device, comprising:
a metal layer;
an adhesive layer on the metal layer;
a reflective layer on the adhesive layer;
a light emitting structure comprising a first conductive type semiconductor layer, an active layer, a second conductive type semiconductor layer on the reflective layer;
an electrode on the light emitting structure;
a current blocking layer between the electrode and the adhesive layer;
a current spreading portion on the second conductive type semiconductor layer; and
a passivation layer on an inclined surface of the light emitting structure and an upper portion of the light emitting structure;
wherein the electrode comprises a first layer, a second layer under the first layer, and a third layer between the first layer and the second layer,
wherein the first layer includes Au, the second layer includes Pt, and the third layer includes Cr,
wherein a thickness of the electrode is about 1 μm to about 10 μm;
wherein an upper surface of the first layer of the electrode has a first roughness,
wherein the electrode contacts the current spreading portion,
wherein an upper surface of the second conductive type semiconductor layer has a second roughness,
wherein the current spreading portion has an inclined surface, and
wherein a portion of the current blocking layer vertically overlaps with the electrode and the reflective layer and directly contacts the light emitting structure.

28. The light emitting device of claim 27, wherein the second roughness has a concave and a convex shape with inclined surfaces, which are met at an apex thereof.

29. The light emitting device of claim 27, wherein the electrode is on a first upper portion of the second conductive type semiconductor layer and the current spreading portion is on a second upper portion of the second conductive type semiconductor layer; and
wherein an area of the second upper portion is greater than an area of the first upper portion.

30. The light emitting device of claim 27, wherein the reflective layer has a shape corresponding to a shape of the electrode.

* * * * *